United States Patent
Miyano et al.

(10) Patent No.: US 9,449,848 B2
(45) Date of Patent: Sep. 20, 2016

(54) MANUFACTURING METHOD FOR SEMICONDUCTOR DEVICE, ANNEALING DEVICE, AND ANNEALING METHOD

(71) Applicant: KABUSHIKI KAISHA TOSHIBA, Tokyo (JP)

(72) Inventors: Kiyotaka Miyano, Tokyo (JP); Wakana Kai, Kanagawa (JP); Tatsunori Isogai, Mie (JP); Tomonori Aoyama, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/013,885

(22) Filed: Aug. 29, 2013

(65) Prior Publication Data

US 2014/0087547 A1    Mar. 27, 2014

(30) Foreign Application Priority Data

Sep. 21, 2012    (JP) ................ 2012-208485

(51) Int. Cl.
| | |
|---|---|
| *H01L 21/324* | (2006.01) |
| *H05B 6/80* | (2006.01) |
| *H01L 21/67* | (2006.01) |
| *H01L 29/66* | (2006.01) |
| *H01L 21/8238* | (2006.01) |

(52) U.S. Cl.
CPC ....... *H01L 21/324* (2013.01); *H01L 21/67103* (2013.01); *H01L 29/66795* (2013.01); *H05B 6/80* (2013.01); *H05B 6/806* (2013.01); *H01L 21/823821* (2013.01)

(58) Field of Classification Search
None
See application file for complete search history.

(56) References Cited

U.S. PATENT DOCUMENTS

| | | | |
|---|---|---|---|
| 6,172,399 B1 | 1/2001 | Lee et al. | |
| 6,593,215 B2 * | 7/2003 | Hiraga | .......... C30B 1/023 257/E21.134 |
| 6,653,179 B1 * | 11/2003 | Minegishi et al. | ......... 438/166 |
| 2004/0266147 A1 | 12/2004 | Shimomura et al. | |
| 2006/0190438 A1 | 8/2006 | Brei | |
| 2011/0076842 A1 | 3/2011 | Yoshino et al. | |
| 2011/0097881 A1 | 4/2011 | Vandervorst et al. | |
| 2011/0111580 A1 | 5/2011 | Aoyama et al. | |
| 2012/0100665 A1 * | 4/2012 | Li et al. | ............... 438/87 |
| 2013/0023102 A1 * | 1/2013 | Aoyama et al. | ............ 438/301 |
| 2013/0023111 A1 * | 1/2013 | Purtell | ............... 438/486 |
| 2014/0283734 A1 * | 9/2014 | Monden et al. | ............... 117/8 |

FOREIGN PATENT DOCUMENTS

| | | |
|---|---|---|
| JP | 2010-189473 A | 9/2010 |
| JP | 2011-061072 A | 3/2011 |

* cited by examiner

*Primary Examiner* — Pamela E Perkins
(74) *Attorney, Agent, or Firm* — Patterson & Sheridan, LLP

(57) ABSTRACT

According to one embodiment, the manufacturing method for the semiconductor device according to the embodiment includes carrying out ion implantation to the semiconductor layer and forming an amorphous layer on the surface of the semiconductor layer, and a heat treatment process using microwave annealing at a temperature higher than or equal to 200° C. and lower than or equal to 700° C. and single crystallizes the amorphous layer.

18 Claims, 25 Drawing Sheets

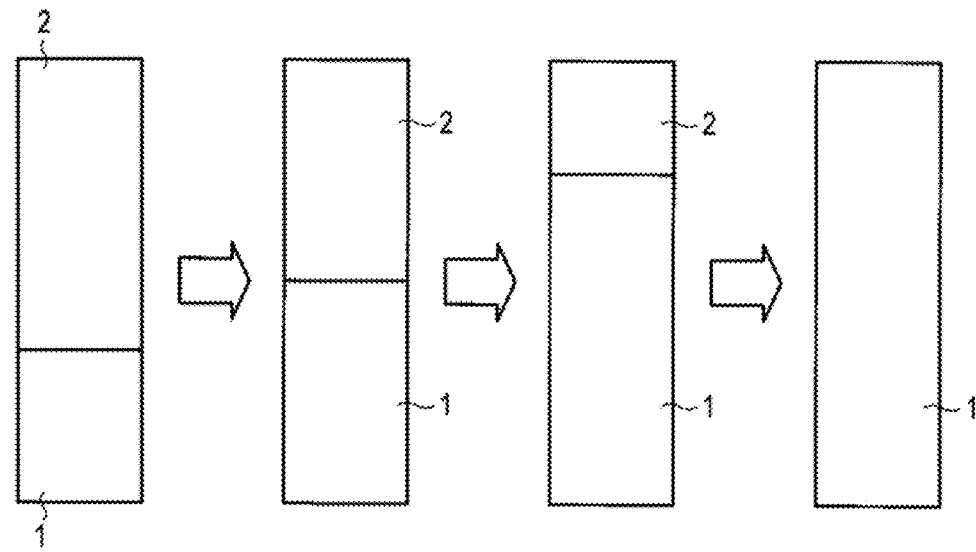
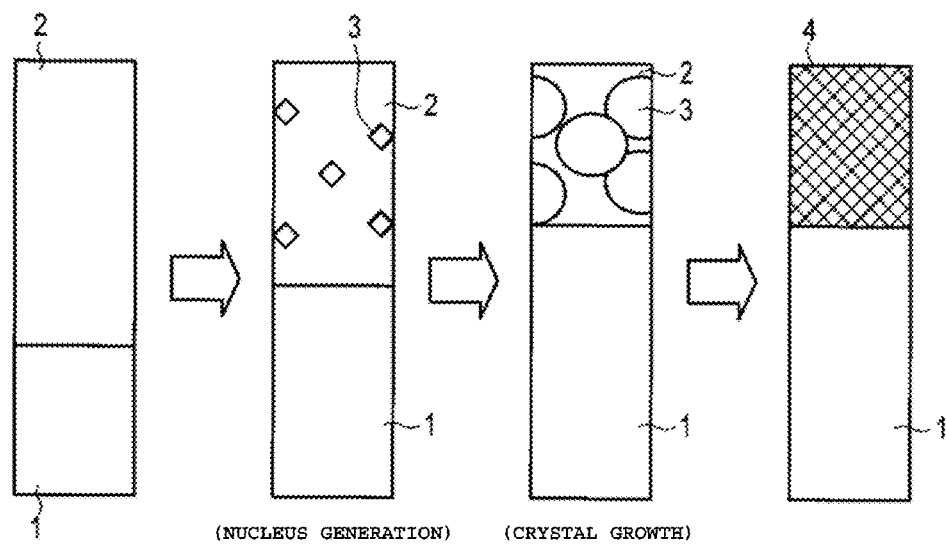

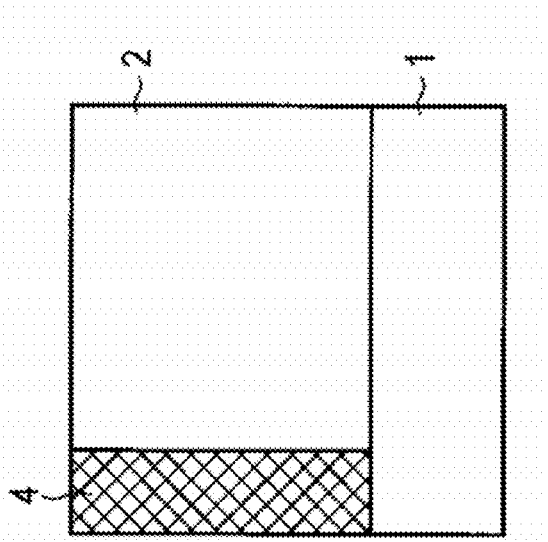
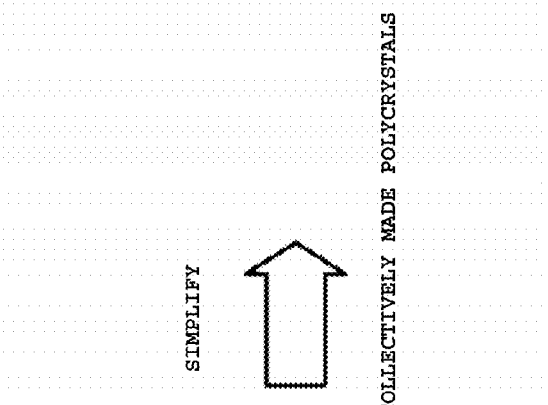
DEFINITION OF POLYCRYSTALLIZATION
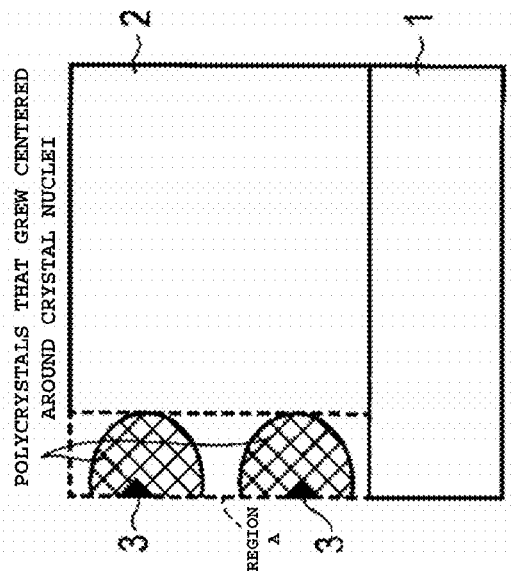

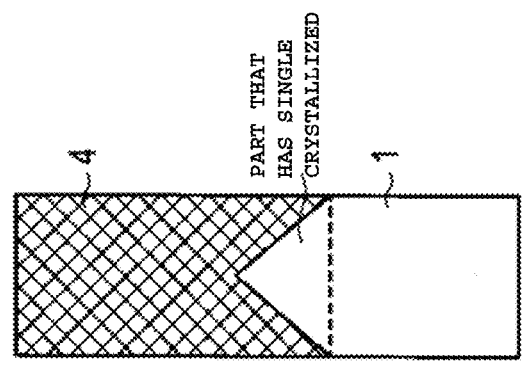
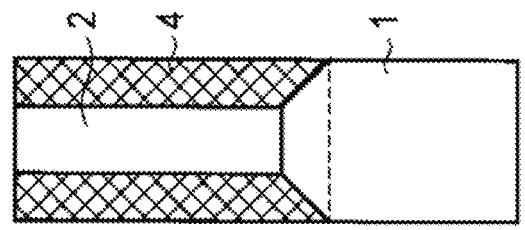
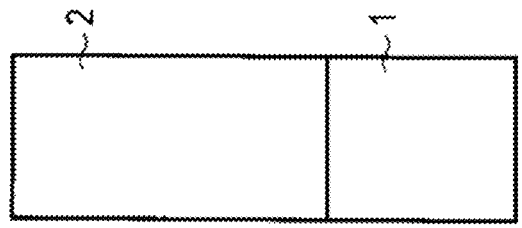

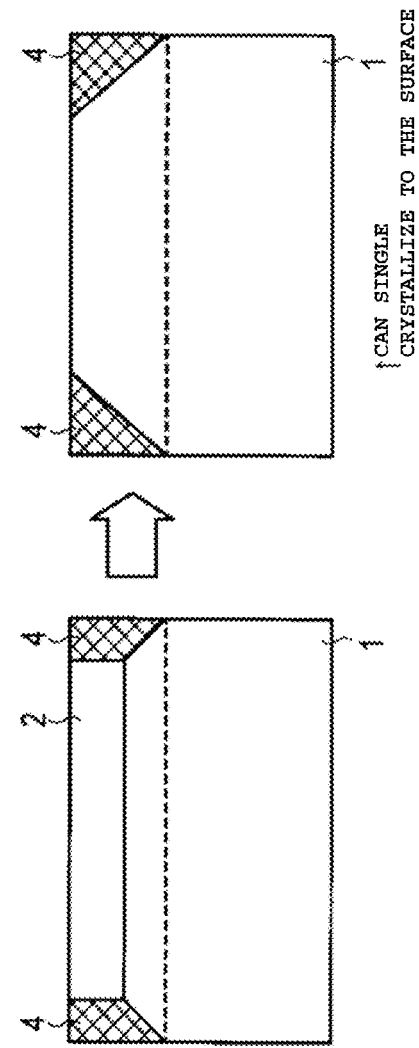
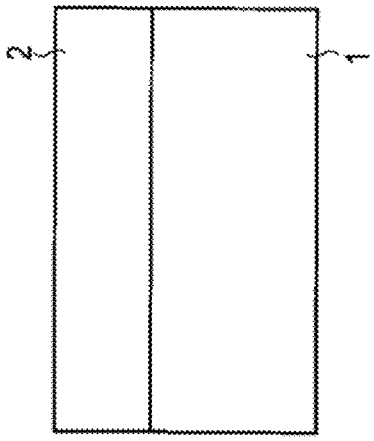
FIG. 5A  FIG. 5B  FIG. 5C
IN THE CASE OF A WIDE REGION
CAN SINGLE CRYSTALLIZE TO THE SURFACE

TEM IMAGE AFTER ANNEALING

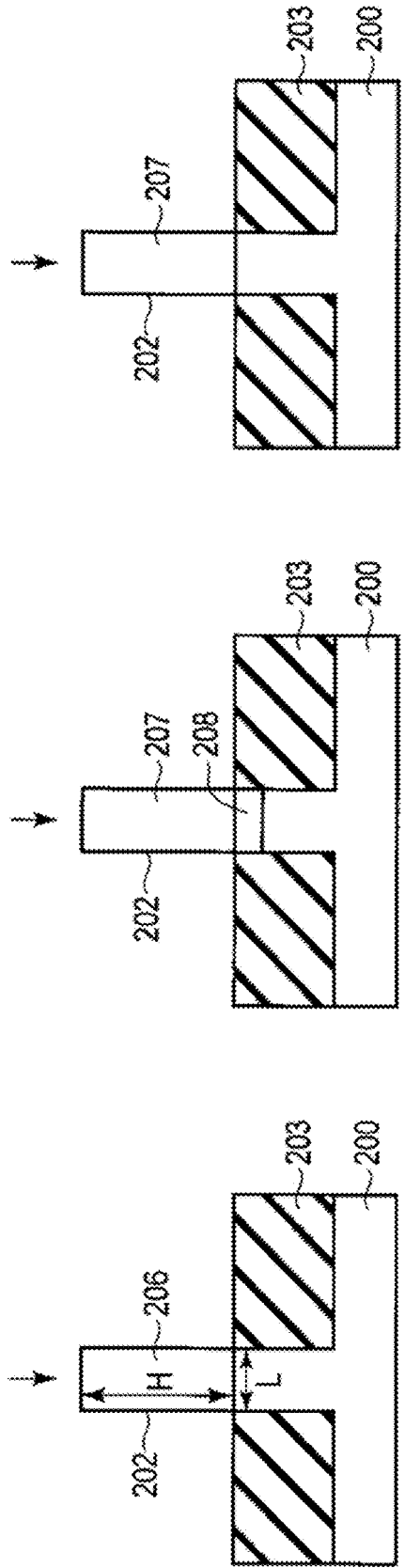

THE TEMPERATURE DEPENDENCY OF THE MAGNETIC PROPERTY OF
MAGNETIC ALLOY (Tc = 220°C)

MICROWAVE HEATING PROPERTY OF MAGNETIC ALLOY (Tc = 220°C)

MANUFACTURING METHOD FOR SEMICONDUCTOR DEVICE, ANNEALING DEVICE, AND ANNEALING METHOD

CROSS-REFERENCE TO RELATED APPLICATION

This application is based upon and claims the benefit of priority from Japanese Patent Application No. 2012-208485, filed Sep. 21, 2012; the entire contents of which are incorporated herein by reference.

FIELD

Embodiments described herein relate to a manufacturing method for a semiconductor device using microwave annealing, an annealing device, and an annealing method.

BACKGROUND

In recent years, with the miniaturization of semiconductor devices, the representative dimensions of their basic constituent elements—transistors—have reached the level of less than or equal to several tens of nanometers. Additionally, in order to achieve higher densities and improvement in element capability, in place of the conventional planar transistor (flat surface) structure, three-dimensional (3D) structures are being employed as well.

Regarding the forming of the source/drain of transistors, in general, first, dopants are introduced to the desired depth of the semiconductor layer using ion implantation, after which, heat treatment (active annealing) is carried out. That is, with the introduction of dopants, the surface of the single crystal semiconductor layer is amorphized, and with active annealing, the amorphous region is recrystallized and implant defects are ameliorated. Generally, for this active annealing, a few seconds of RTA (Rapid Thermal Annealing) at around 1000° C. is performed.

On the other hand, from the perspective of miniaturization, the processing width of the semiconductor chip that has a three-dimensional structure must be scaled down. For this reason, the area of the amorphous/single crystal interface, which becomes the crystal nucleus when changing the amorphous region back to a single crystal, becomes relatively small. Under these circumstances, before the entire amorphous region returns back to a single crystal, minute crystal nuclei come into being at random locations due to heat, and crystal growth occurs with those crystal nuclei as the points of origin.

Thus, especially in the case of fine three-dimensional structures, due to active annealing, the amorphized region grows into a polycrystalline semiconductor instead of a single crystal. In the case that it is polycrystallized, its own resistivity rises while the contact resistance between the polycrystalline layer and the metal wiring rises by over three-digits, and the parasitic resistance that is formed in series in the semiconductor device increases, causing degradation in the device characteristics.

In this way, with conventional active annealing, due to the miniaturization of semiconductor chips, crystal defects of the semiconductor layers by the introduction of dopants could not be sufficiently recovered.

DESCRIPTION OF THE DRAWINGS

FIGS. 1A to 1D are diagrams showing an ideal crystal growth of the single crystal layer and the amorphous layer regarding each embodiment.

FIGS. 2A to 2D are diagrams showing the realistic crystal growth of the single crystal layer and the amorphous layer regarding each embodiment.

FIGS. 3A and 3B are diagrams that explain the definition of polycrystallization regarding each embodiment.

FIGS. 4A to 4C are diagrams showing the single crystallization of a small region regarding each embodiment.

FIGS. 5A to 5C are diagrams showing the single crystallization of a wide region regarding each embodiment.

FIGS. 21A to 21F are cross-section diagrams that show the manufacturing process of the fin FET according to the second embodiment.

DETAILED DESCRIPTION

Figure 6B:
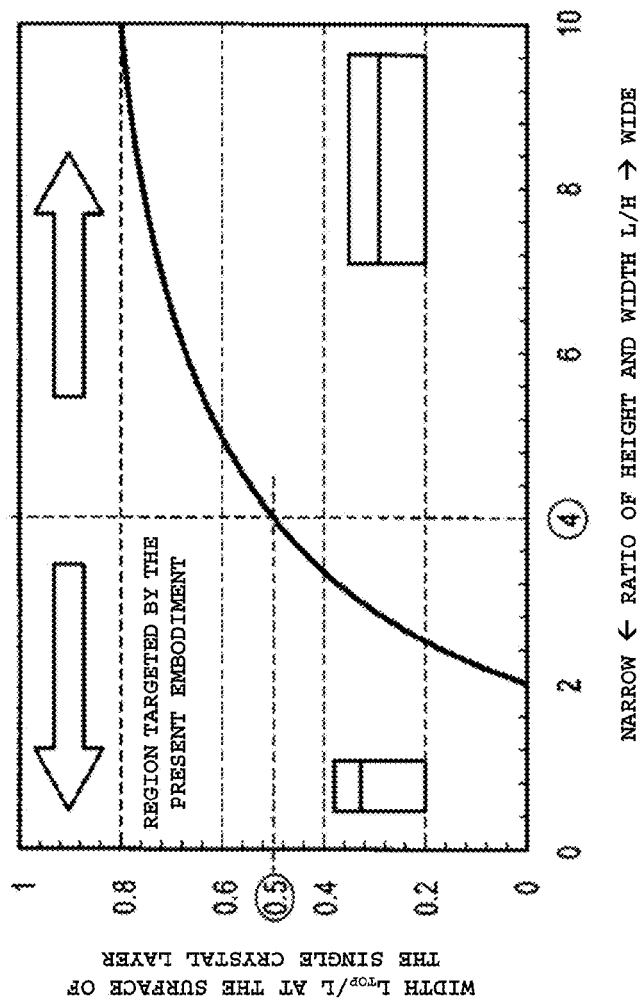
FIGS. 6A and 6B are diagrams that explain the processing width (the ratio of the height and width of the amorphous layer L/H) of the chip regarding each embodiment.

In general, according to one embodiment, a manufacturing method of a semiconductor device according to the embodiment comprises carrying out ion implantation on a semiconductor layer and forming an amorphous layer on the surface of the semiconductor layer thereby, and having a heat treatment step where, using microwave annealing, at a temperature that is higher than or equal to 200° C. and lower than or equal to 700° C., the amorphous layer is re-crystallized in the single crystal lattice of the semiconductor layer.

[1] Discussion Regarding the Processing Width of the Chip

The relationship between miniaturization of the processing width of the semiconductor chip and crystal growth is described using FIG. 1 through FIG. 6. In this description, a structure where a single crystal layer touches an amorphized layer (amorphous layer) is used.

At the various semiconductor devices, mainly in forming the source/drain region, after dopants are introduced to the single crystal semiconductor layer by ion implantation, active annealing is carried out. With this active annealing, the dopant atom that is implanted is moved to the lattice location of the single crystal semiconductor layer and the dopant is electrically activated. For example, for electrical activation, dopant densities of around $1E20\ cm^{-3}$ are favorable. Here, in the case that ions with a relatively large mass, such as phosphorus or arsenic are implanted, the surface of the single crystal semiconductor layer changes to an amorphous state. An amorphous semiconductor has large resistance, hampering device performance. For this reason, it becomes important, at the time of active annealing, to revert this amorphized region back to a single crystal.

As mentioned above, ideally, as shown in FIG. 1A through FIG. 1D, due to the heat treatment for activation, the amorphous layer 2 of the part that touches the single crystal layer 1 grows into a single crystal over time.

However, with semiconductor devices of recent years that have fine processing widths, realistically, as shown in FIG. 2A through FIG. 2D, due to the demand for heat treatment at a high temperature, at some point, crystal nuclei 3 are generated within the amorphous layer 2. These crystal nuclei 3 often occur on the side surface of the amorphous layer 2 (for example, the portion where it touches the oxidized film, etc. for element isolation). And since crystallization begins with these crystal nuclei 3 as the origin, in the end, the upper side of the semiconductor layer becomes a polycrystalline layer that does not continue with the crystallinity of the underlying layer. That is, in a semiconductor chip that has a fine processing width, the area of the amorphous/single crystal interface that becomes the crystal nucleus when reverting the amorphous layer 2 back to a single crystal becomes relatively small, and crystal growth occurs before the entire amorphous layer 2 reverts back to a single crystal, with the minute crystal nuclei 3 that formed due to heat as the origin points of these crystals. Therefore, in the case of fine structures, regions that are amorphized due to heat treatment would grow into a polycrystalline layer 4 instead of recovering into a single crystal.

This kind of situation will be modeled based on the assumptions below.

Assumption (1) Crystal nuclei 3 are generated only on the side surface of the amorphous layer 2. This is because the probability of generation of crystal nuclei 3 is thought to be lower in the interior than the side surface of the amorphous layer 2.

Assumption (2) Crystal nuclei 3 are generated on the side surface of the amorphous layer 2 at the same time the substrate is heat treated. This is because it is cumbersome to take into account the time lag until the crystal nuclei 3 are generated.

Assumption (3) Crystal growth from the bottom surface of the amorphous layer 2 and the crystal growth from the side surface of the amorphous layer 2 progress at the same speed.

Further, for the sake of simplicity, the polycrystalline layer 4 is defined as shown in FIG. 3A and FIG. 3B. That is, as described in Assumption (1), in the case that it is assumed that crystal nuclei 3 are only formed on the side surface of the amorphous layer 2, region A that includes multiple polycrystals that grow centered around the crystal nuclei 3 shall be collectively polycrystalline layer 4.

When modeling like the above is carried out, in regions where the processing width of formed devices is narrow (for example, cell transistors, fin-type transistors, etc.) and regions where it is wide (for example, peripheral transistors, planar-type transistors, etc.), the appearance of single crystallization of the amorphous regions due to heat treatment become like the following.

As shown in FIG. 4A and FIG. 4B, FIG. 5A and FIG. 5B, if heat treatment is done, the polycrystalline layer 4 expands from the side surface of the amorphous layer 2, and the single crystal layer 1 grows upwards. Here, in the case of regions wherein the processing width of the devices is narrow, as shown in FIG. 4C, polycrystallization of the amorphous layer 2 in the width direction progresses faster than the single crystal layer 1 grows to the surface of the amorphous layer 2, the surface of the semiconductor layer will not regain a single crystal structure. On the other hand, in the case of regions wherein the processing width of the devices is wide, as shown in FIG. 5C, the single crystal layer 1 grows to the surface of the amorphous layer 2 quicker than the polycrystallization of the amorphous layer 2 in the width direction, the re-single crystallization of the semiconductor layers to the surface becomes possible.

Figure 6A:
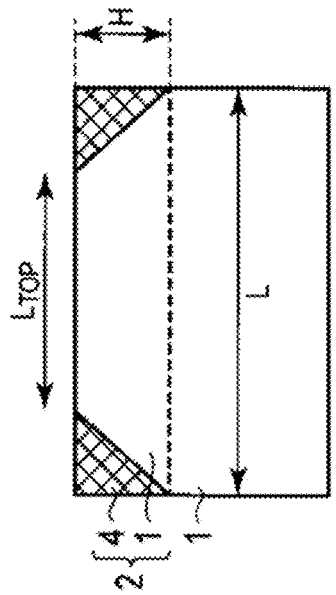

Based on such observations, the present model can attempt quantification in the following way. That is, as shown in FIG. 6A, the width of the amorphous layer 2 that is created on the surface of the semiconductor layers with the introduction of dopants is made L, the height is made H, and the width of the single crystal layer 1 at the surface after single crystallization has progressed due to heat treatment shall be made $L_{TOP}$. The width $L_{TOP}$ of this single crystal layer 1 at the surface depends on the width L and height H of the amorphous layer 2. The relation of $L_{TOP}/L$ to the ratio of the height and width of the amorphous layer 2 L/H is as shown in FIG. 6B. That is, the larger the ratio of the height and width of the amorphous layer 2 L/H, the larger the $L_{TOP}/L$.

Here, for example, it is preferable that $L_{TOP}$ is half of L (0.5 L), that is, that $L_{TOP}/L$ is 0.5. In this case, L/H≥4 is a region where single crystal re-crystallization is possible all the way to the surface, even with conventional technology that uses RTA. For this reason, the present embodiment is thought to be especially effective for chips that have a region where single crystallization to the surface is difficult using conventional technology that utilizes RTA, that is, those that have a processing width that satisfy the relationship L/H<4.

However, the present embodiment can of course be applied to chips that have a processing width with the relationship L/H≥4.

Below, specific embodiments will be described with reference to the drawings.

[2](First Embodiment)

In the first embodiment, after introduction of dopants, by carrying out annealing using microwaves at a temperature that is higher than or equal to 200° C. and lower than or equal to 700° C., the amorphized region is single crystallized, and the crystal defect is recovered.

[2-1] Manufacturing Method

The manufacturing method for the semiconductor device according to the first embodiment is described using FIG. 7 through FIG. 16. Meanwhile, FIG. 7 through FIG. 15 show the GC cross-section in the word line direction of a memory cell, and FIG. 16 shows a schematic of the AA cross-section in the bit line direction of a memory cell. Here, a NAND-type flash memory is given as an example of a semiconductor device, but it is not limited to this.

Figure 7:
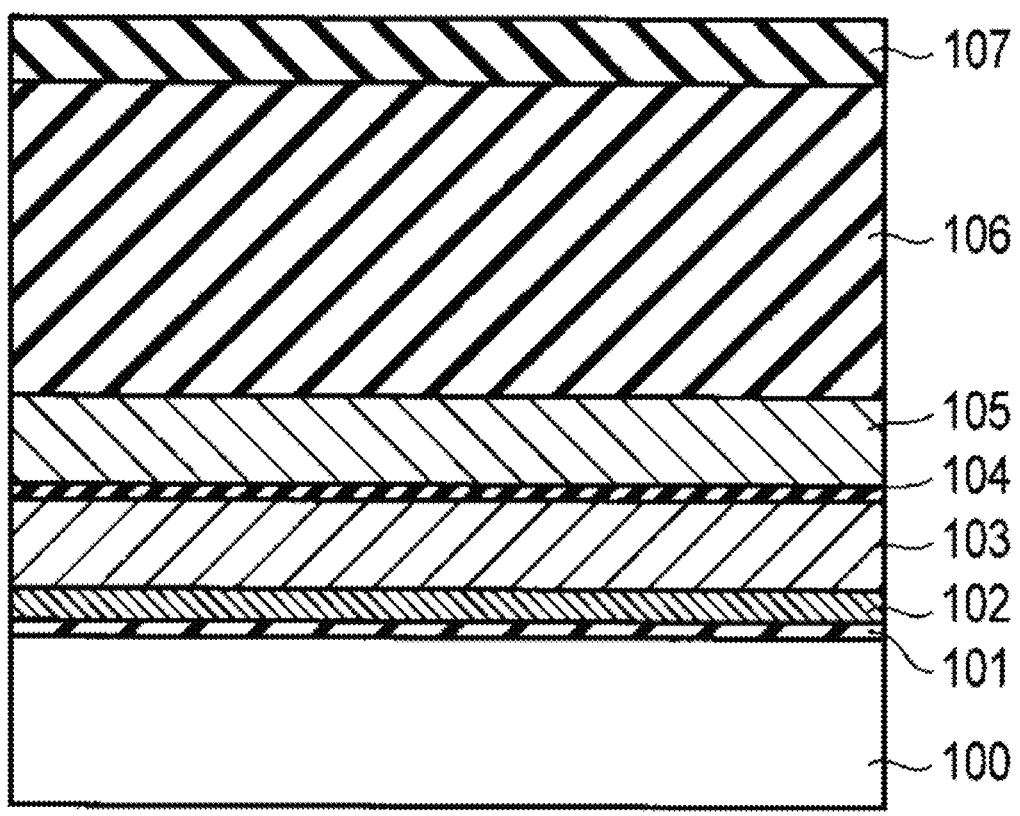
FIG. 7 is a cross-section diagram that shows the manufacturing process of a flash memory according to the first embodiment.

First, as shown in FIG. 7, a gate insulating film 101 is formed on a silicon substrate 100. On this gate insulating film 101, a first floating gate electrode (FG1: undoped amorphous silicon) 102 is formed at around 40 nm, using LPCVD (Low Pressure Chemical Vapor Deposition). Formed on this first floating gate electrode 102 is a second floating gate electrode (FG2: P doped amorphous silicon) 103 at around 130 nm. Next, on the second floating gate electrode 103, an ONO (Oxide Nitride Oxide) film 104 including oxide film/nitride film/oxide film is film-formed by LP-CVD method at around 700° C. Next, on the ONO film 104, a first control gate electrode (GC1: polysilicon) 105 is film-formed at around 40 nm by the CVD method at 525° C. Next, on the first control gate electrode 105, BSG (boron silicate glass) 106 is film formed at around 200 nm as the mask material by the LPCVD method at around 700° C. Here, in the case of selectively detaching only this mask material after the RIE (Reactive Ion Etching) step, BSG with heavily doped boron should be used. Further, on the BSG layer 106, a TEOS (Tetra Ethyl Ortho Silicate) film 107 is film formed at around 100 nm as an AA mask material by the LPCVD method at around 700° C.

Figure 8:
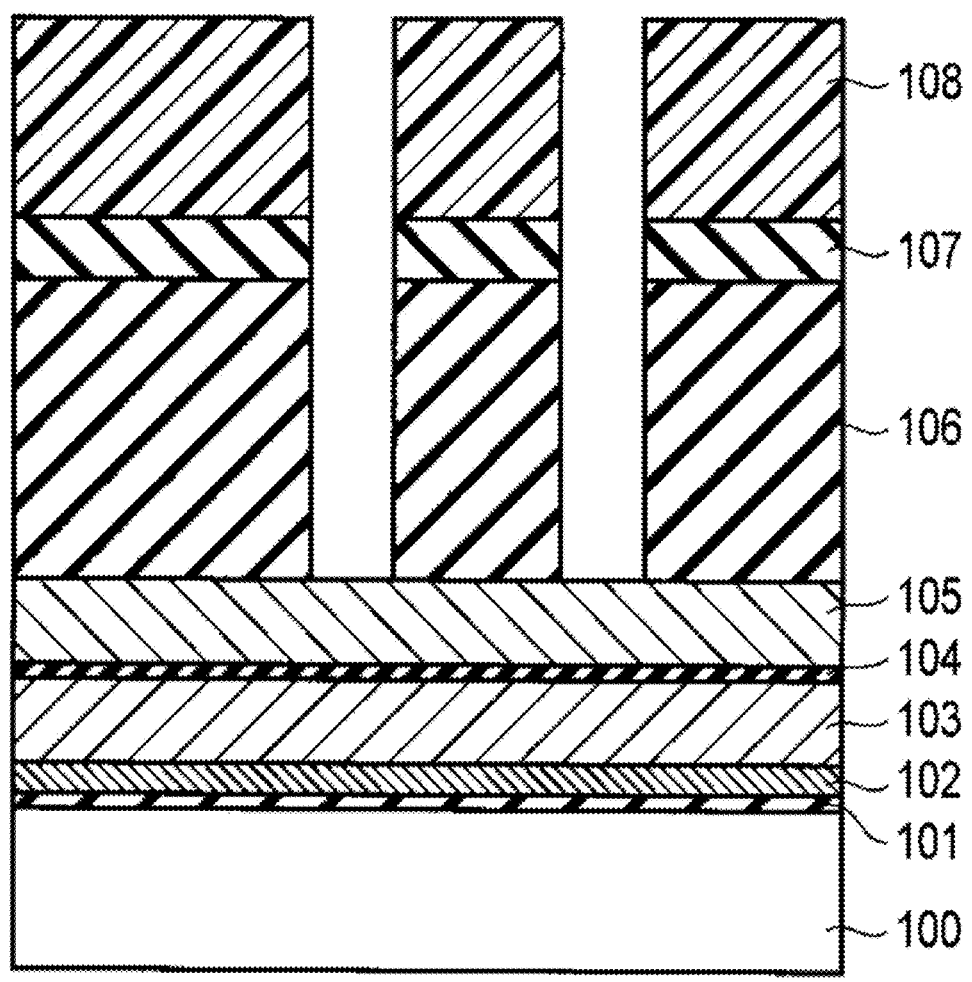
FIG. 8 is a cross-section diagram that shows the manufacturing process of the flash memory according to the first embodiment, following FIG. 7.

Next, as shown in FIG. 8, a resist material 108 is applied on the TEOS film 107, and is patterned. Using this patterned resist material 108, the TEOS film 107 and BSG film 106 are etched by RIE, until the surface of the first control gate electrode 105 is exposed.

Figure 9:
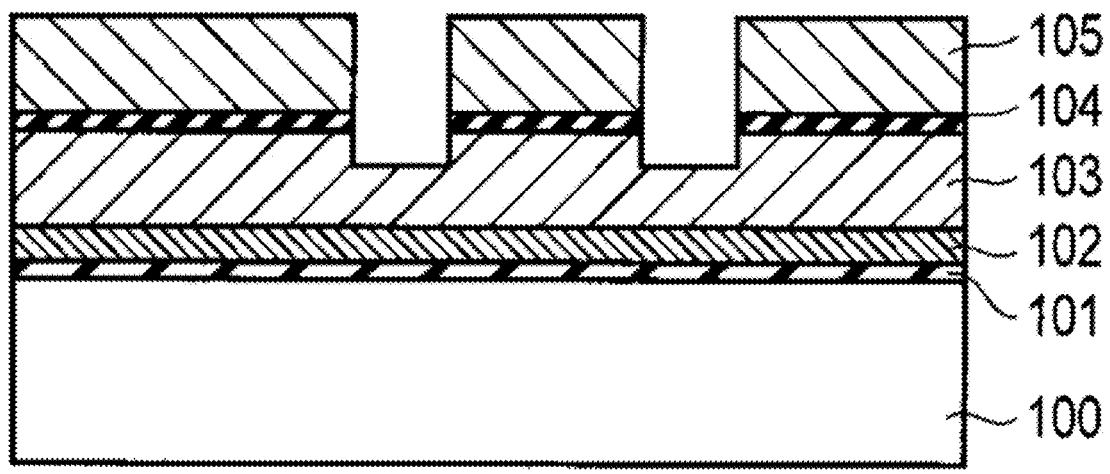
FIG. 9 is a cross-section diagram that shows the manufacturing process of the flash memory according to the first embodiment, following FIG. 8.

Next, as shown in FIG. 9, the first control gate electrode 105, ONO film 104, and a part of the second floating gate electrode 103 are processed using the TEOS film 107 and BSG film 106 as the masks, after which, the mask materials, TEOS film 107 and BSG film 106 are stripped off using HF.

Figure 10:
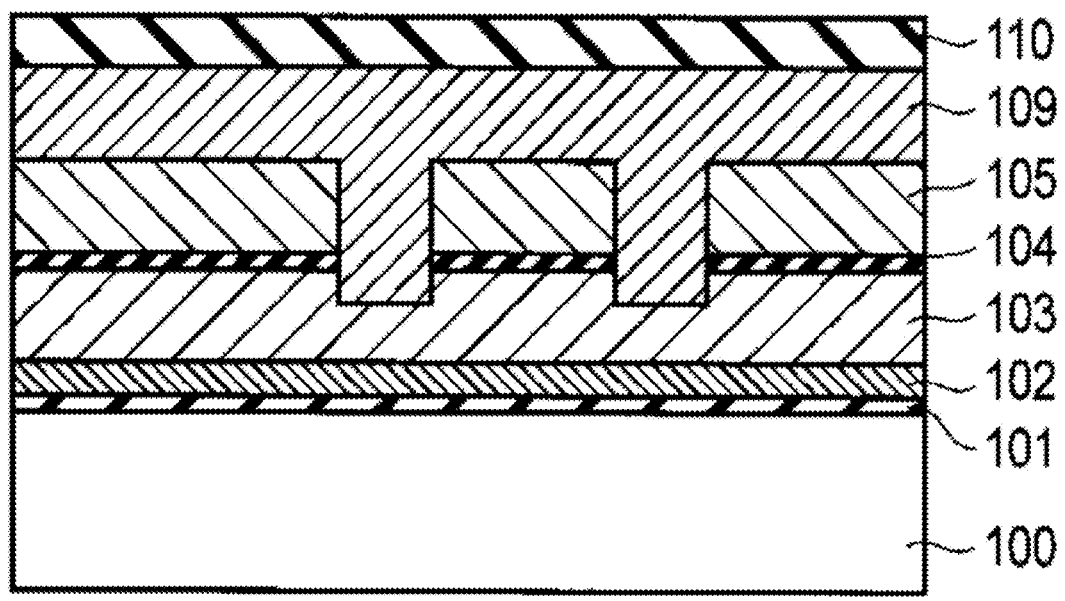
FIG. 10 is a cross-section diagram that shows the manufacturing process of the flash memory according to the first embodiment, following FIG. 9.

Next, as shown in FIG. 10, on the second floating gate electrode 103 and the first control gate electrode 105, a second control gate electrode (GC2: P doped amorphous silicon) 109 is formed at around 200 nm at around 550° C. On this second control gate electrode 109, using DCS (dichloro silane) gas, a pad SiN film 110 that functions as an etch stop film at the time of the RIE etch process is formed to a thickness around 70 nm at 800° C.

Figure 11:
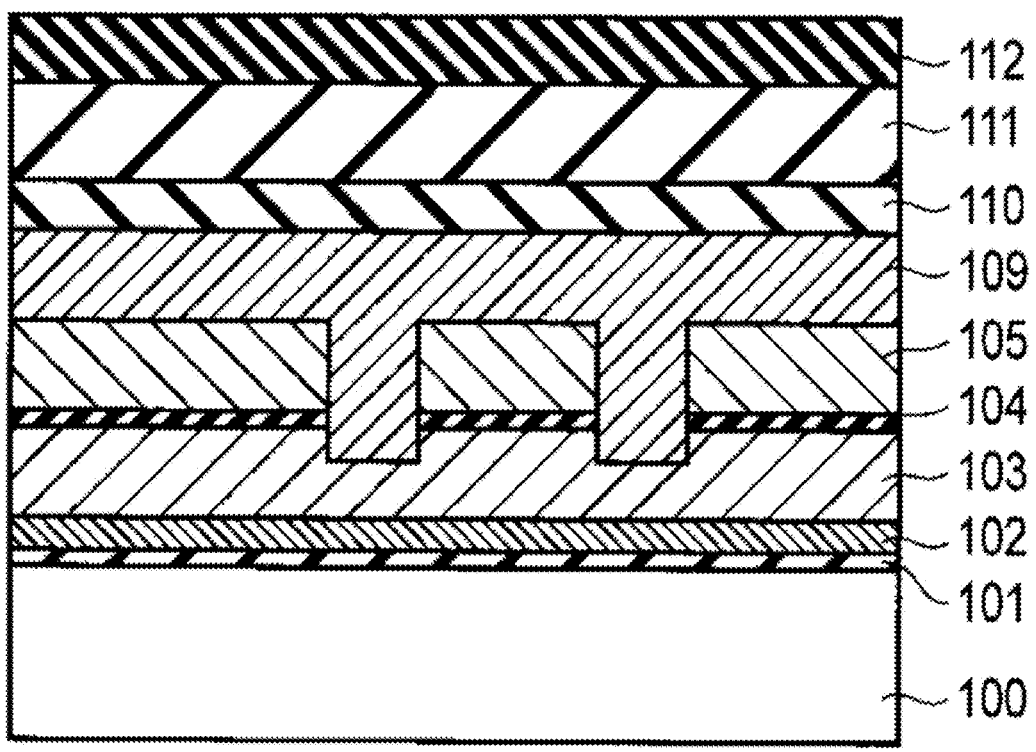
FIG. 11 is a cross-section diagram that shows the manufacturing process of the flash memory according to the first embodiment, following FIG. 10.

Next, as shown in FIG. 11, on the SiN film 110, mask materials BSG film 111 and TEOS film 112 are deposited in order.

Figure 12:
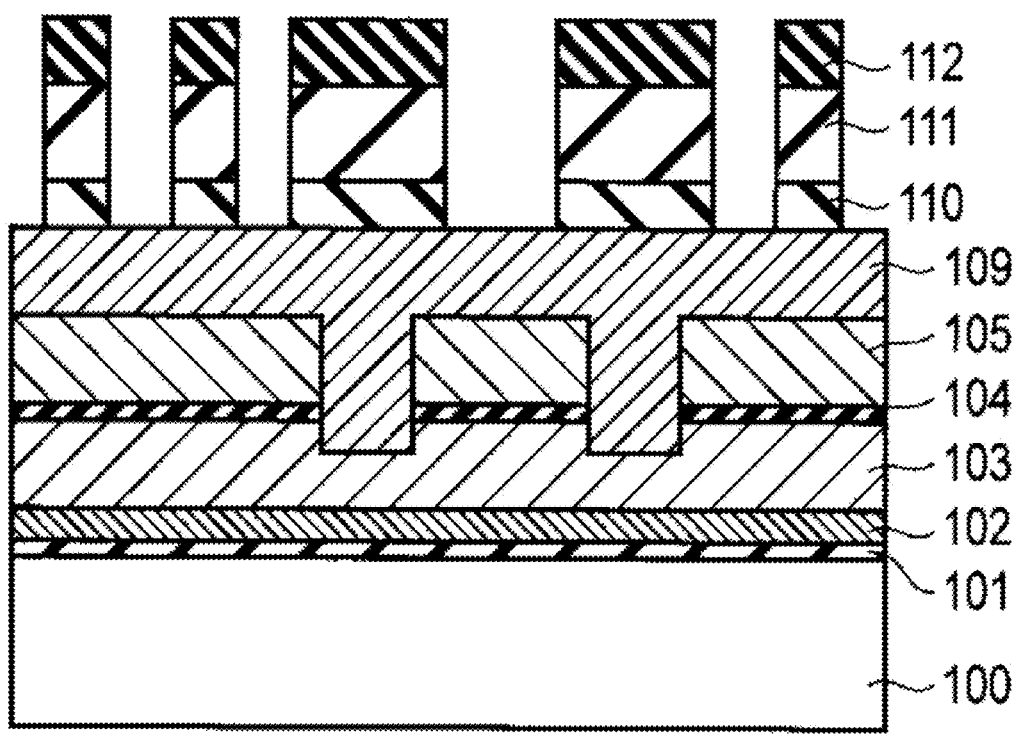
FIG. 12 is a cross-section diagram that shows the manufacturing process of the flash memory according to the first embodiment, following FIG. 11.

Next, as shown in FIG. 12, with the PEP (Photo Engraving Process) step, the SiN film 110, BSG film 111, and TEOS film 112 are processed into a hardmask.

Figure 13:
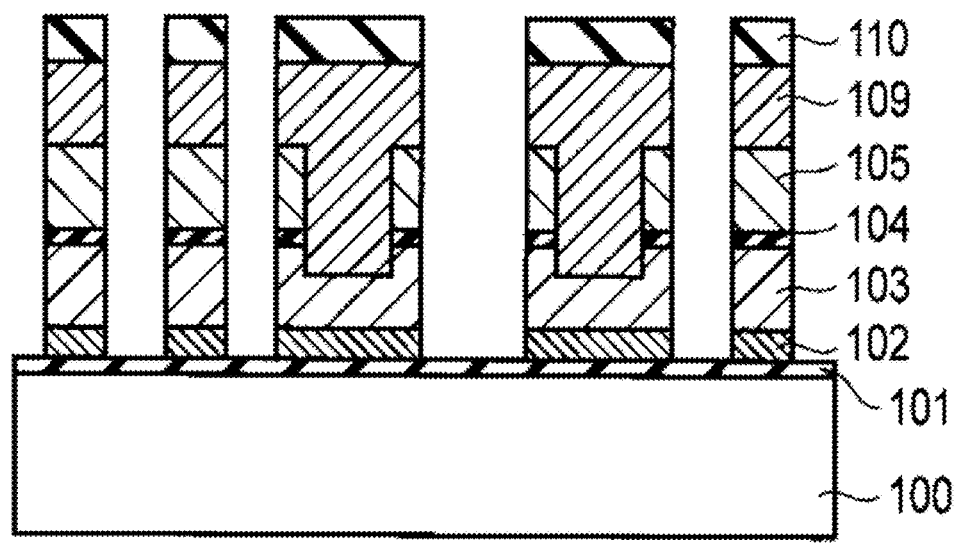
FIG. 13 is a cross-section diagram that shows the manufacturing process of the flash memory according to the first embodiment, following FIG. 12.

Next, as shown in FIG. 13, using processed masks, the second control gate electrode 109, the first control gate electrode 105, the ONO film 104, the second floating gate electrode 103 and the first floating gate electrode 102 are processed, and a gate stack structure is formed. After that, the BSG film 111 and the TEOS film 112 are stripped off by HF.

Figure 14:
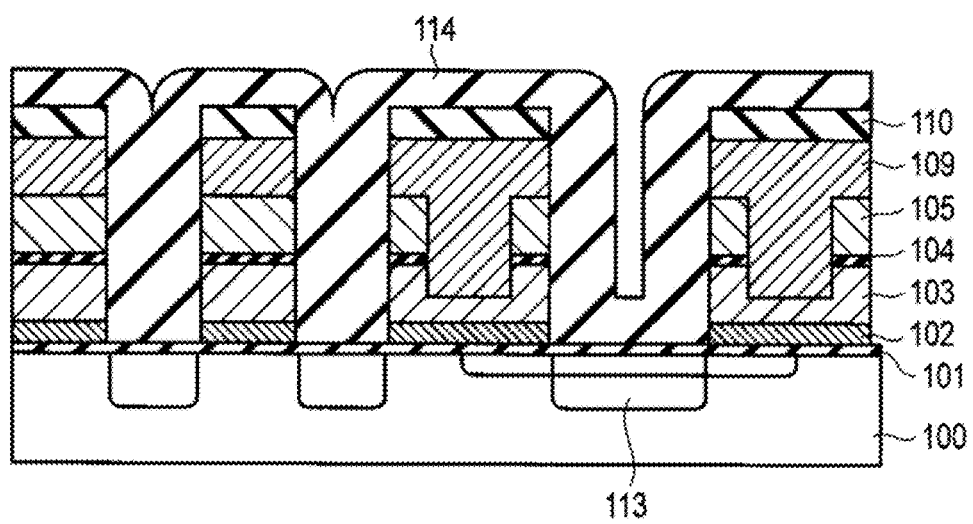
FIG. 14 is a cross-section diagram that shows the manufacturing process of the flash memory according to the first embodiment, following FIG. 13.

Next, as shown in FIG. 14, ion implantation of As and B are carried out, and a dopant region 113 is formed on the surface of the silicon substrate 100. After that, a TEOS film 114 for a spacer is film formed on the silicon substrate 100 and SiN film 110, and RIE processing is carried out.

Figure 15:
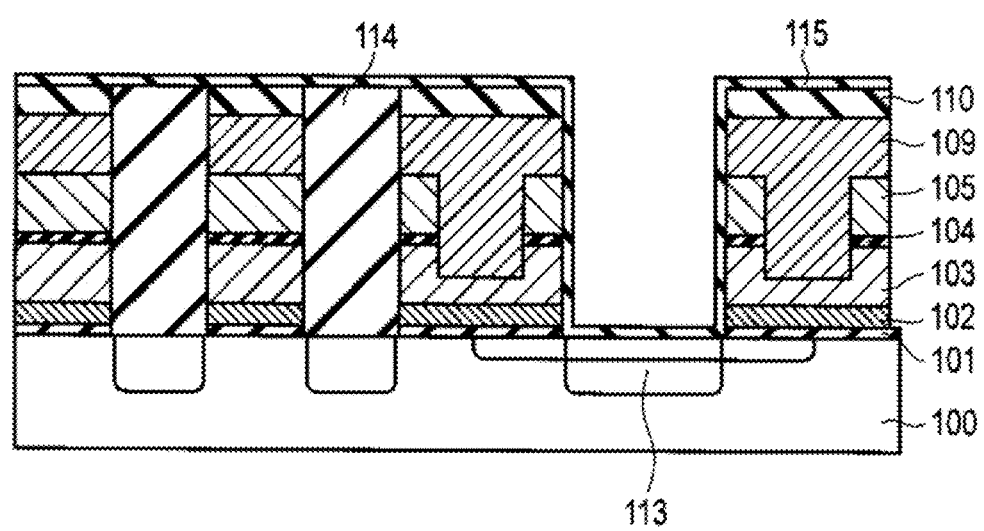
FIG. 15 is a cross-section diagram that shows the manufacturing process of the flash memory according to the first embodiment, following FIG. 14.

Next, as shown in FIG. 15, a SiN film 115 of the GC liner is formed at a thickness of around 30 nm on the silicon substrate 100 and the TEOS film 114.

Figure 16A:
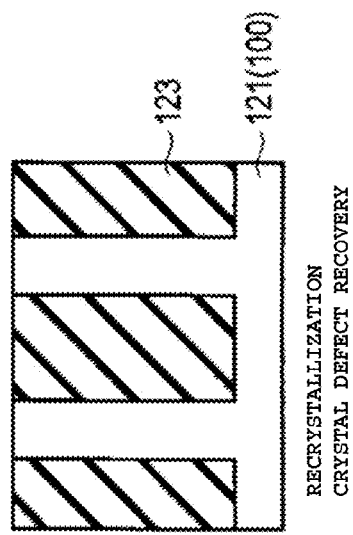
FIGS. 16A to 16C are cross-section diagrams that show the manufacturing process of the flash memory according to the first embodiment, following FIG. 15.

Next, as shown in FIG. 16A, with ion implantation, the dopant region 113 on the surface of the silicon substrate 100 becomes an amorphous layer 122. For example, the height H and width L of this amorphous layer 122 fulfills the relationship L/H<4, and the width L of the amorphous layer 122 is less than 30 nm.

Figure 16B:
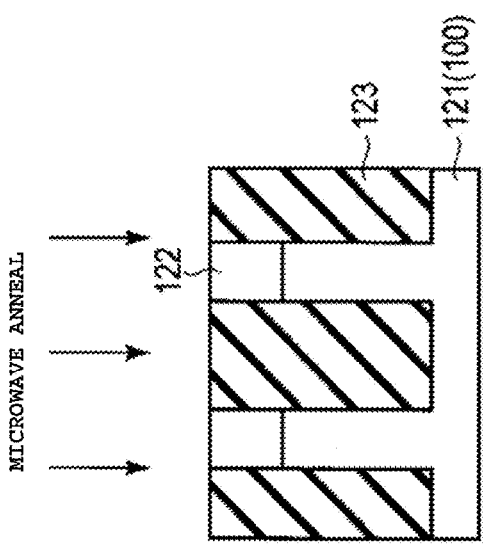
Figure 16C:
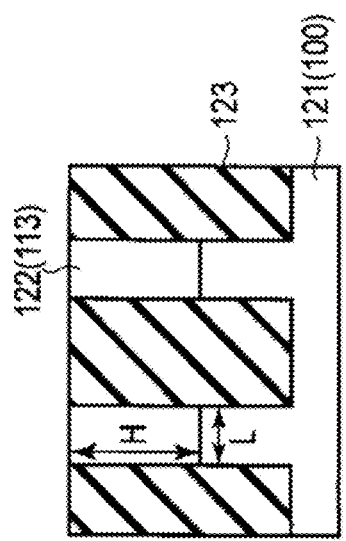

And, as shown in FIG. 16B, in order to activate the dopants and recover the crystal defect of the substrate, for example, a microwave of 5.80 GHz is irradiated on the structure. With the application of microwave energy, the amorphous layer 122 touching the single crystal layer 121, single crystallizes over time due to solid-phase epitaxial growth, and as shown in FIG. 16C, the amorphous layer 122 changes back into a continuation of the single crystal layer 121. The activated dopant density in the single crystallized region due to heat treatment is greater than or equal to 1E20 $cm^{-3}$.

Here, the temperature of microwave annealing is preferably set to higher than or equal to 200° C. and lower than or equal to 700° C. The reasons are as follows.

When the treatment temperature of microwave annealing is high, crystal nuclei are generated in the amorphous layer 122 due to the effect of that high temperature, and crystal growth progresses with those crystal sites as the origins, and the amorphous layer 122 polycrystallizes. Also, in light of the fact that a characteristic of microwave annealing is that crystal growth progresses at low temperature, the preset temperature needs an upper limit. The temperature where the crystal nuclei begin to be generated in the amorphous film is thought to be around 740° C., and further, taking into account the effects of dopants, etc., it is thought that the temperature for microwave annealing should preferably be lower than or equal to 700° C.

On the other hand, when the temperature for microwave annealing is lower than 200° C., it becomes harder for heat to be absorbed by the silicon, and the absorption efficiency of the microwave decreases. For this reason, it is thought that the temperature for microwave annealing should preferably be higher than or equal to 200° C.

[2-2] Effects

Figure 17:
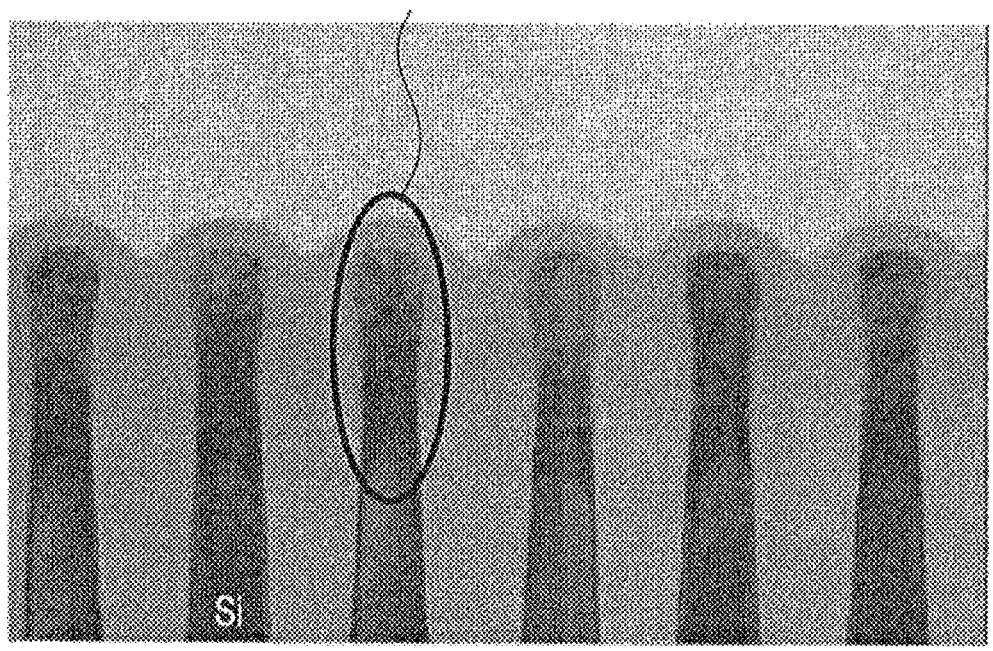
FIG. 17 is a cross-section diagram of the substrate after annealing by TEM (Transmission Electron Microscope) regarding each embodiment.

With the conventional technology that uses RTA, when miniaturization progresses forward, because the area that becomes the seed on the silicon substrate (the area of the interface of the amorphous and single crystal) is narrow, there is a limit to the activation of silicon with RTA. Further, since the conventional heat treatment is high-temperature, due to the problem of dopant proliferation, it is difficult to anneal for a long time, and crystal defects will remain (FIG. 17).

In comparison, according to the first embodiment, upon activating dopants, microwave annealing, which has a lower temperature than that of the conventional one, is used. In the case of this microwave annealing, unlike the conventional RTA, etc., it induces rotary oscillation and pushes forward the activation of dopants as well as being able to re-crystallize the amorphous region. In this way, according to the first embodiment, by using low-temperature microwave annealing after the introduction of dopants, activation of dopants as well as the recovery of the crystal defects of the substrate can be envisaged.

[2-3] Other Manufacturing Methods

In the first embodiment described above, to ion implant the silicon substrate 100, it is also possible to use plasma doping. In this case, crystal defects on the silicon substrate 100 can be reduced. Thereafter, in an atmosphere that includes $H_2$, $N_2$, and Ar, microwave of 5.80 GHz at a power of 10 W/cm² to 1000 W/cm² can be irradiated and control so that the wafer temperature will be lower than or equal to 700° C., and by carrying out activation of dopants, as with the first embodiment described above, crystal defects can be eliminated.

[3](Second Embodiment)

In the second embodiment, after single crystallizing the amorphized region using microwave annealing, by carrying out further heat treatment, crystal defects that occur near the amorphous/single crystal interface are reduced.

[3-1] Discussion on Low-Temperature Annealing and Crystal Defects

In the first embodiment described above, in an attempt to disperse dopants and re-crystallize the amorphous region into the single crystal of the substrate, low-temperature (around 200-700° C.) microwave annealing is used. Here, as described in the first embodiment above, even if it is low-temperature annealing, in the case that the surface of the single crystal semiconductor layer is amorphized, "solid-phase epitaxial growth" occurs, which is the recrystallization of the amorphous layer, with the interface between the single crystal semiconductor layer and the amorphous layer as the origin, and in that process, it is known that the dopant atoms move to the lattice location of the single crystal semiconductor, and are electrically activated. With this method, it is possible to electrically activate dopants that are greater than or equal to 1E20 cm⁻³ even with low-temperature annealing.

Figure 18B:
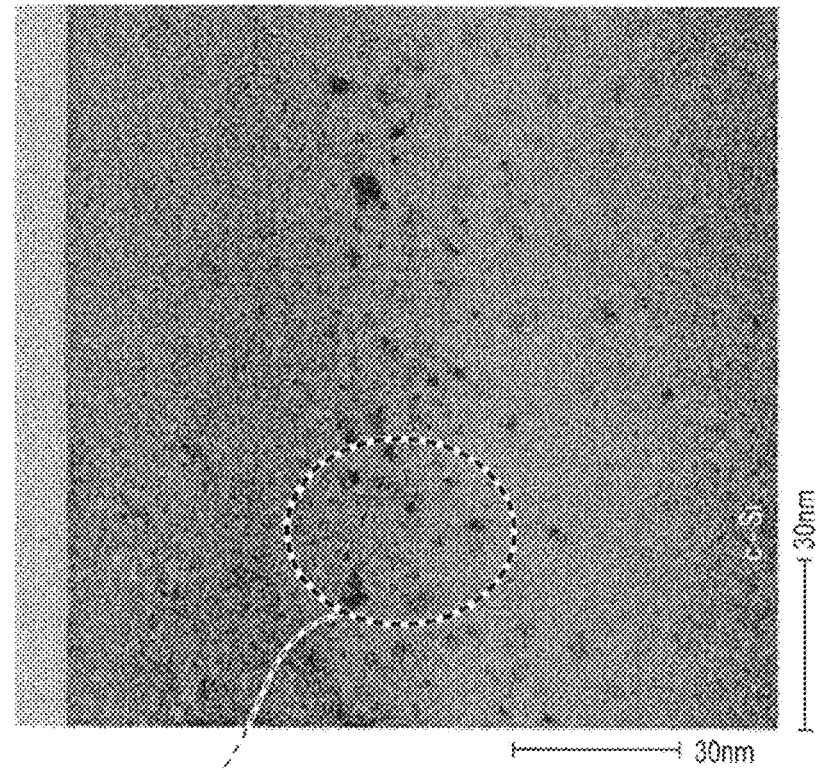
FIGS. 18A and 18B are cross-section diagrams of the substrate after microwave annealing by TEM regarding each embodiment.
Figure 18A:
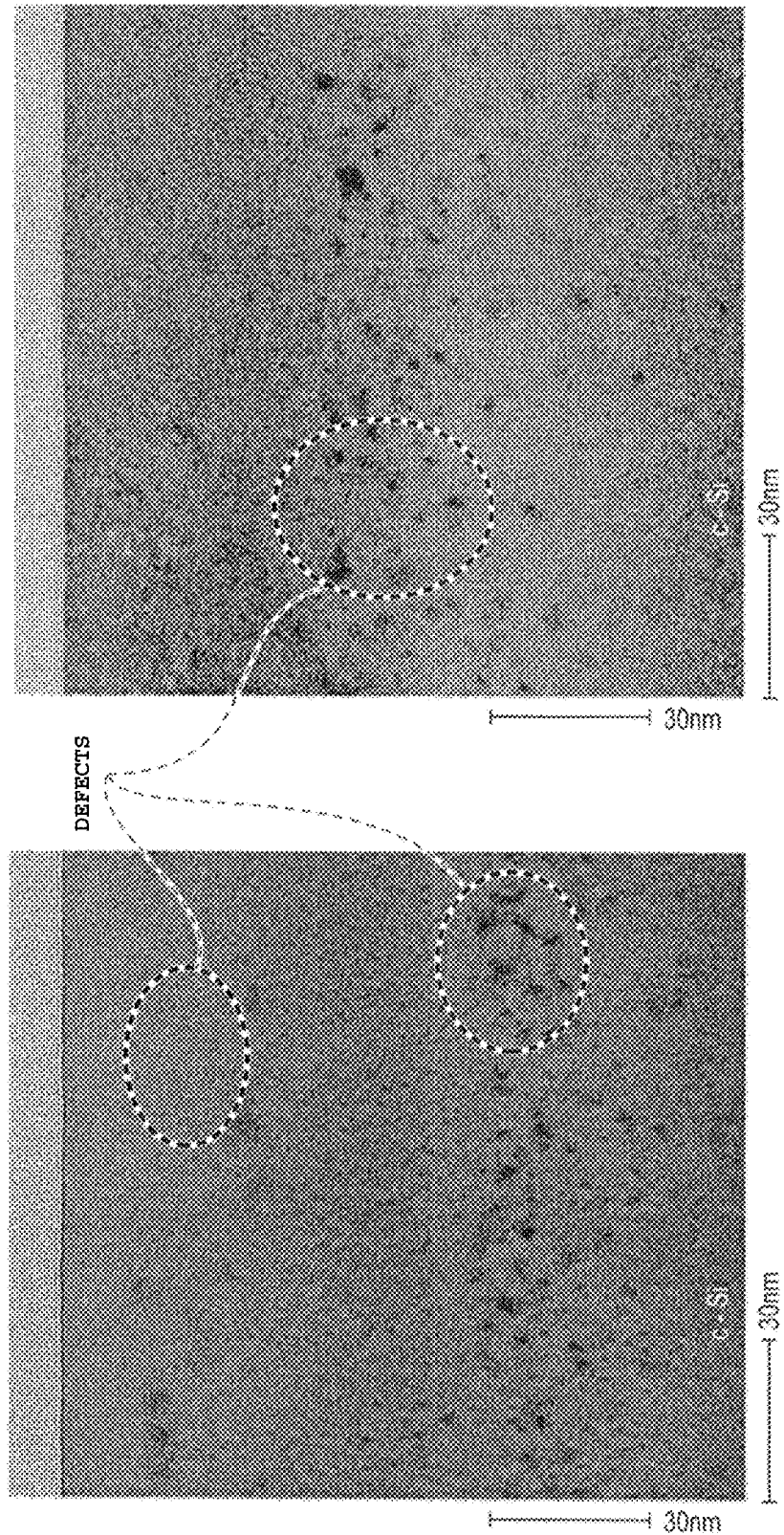

In order to use this kind of low-temperature annealing, it is necessary for the ion implanted region to be amorphized, but there are cases where transition layers with relatively small damages are generated in the interface between the amorphous layer and the single crystal semiconductor layer that are formed by ion implantation. And, at the time of low-temperature annealing, point defects gather and grow in this transition layer, and can form even larger defects (FIG. 18). This kind of crystal defect becomes the generation source of electron hole-pairs in the depletion layer that is generated in the pn-junction. Also, since crystal defects cause increases in the leak current of electronic devices, it is necessary to suppress their generation as much as possible. Meanwhile, in the case of high-temperature annealing, these defects disappear, so an increase in leak currents do not become a problem.

In summary of the above, when a conventional high-temperature active annealing is applied, the region that should caused to crystallize as a continuum of the single crystal of the substrate will polycrystallize, and when a low-temperature active annealing like the first embodiment is applied, there may be cases where crystal defects near the amorphous/single crystal interface cannot be eliminated.

Thus, in the second embodiment, the region amorphized by the first heat treatment using low-temperature microwave annealing is re-crystallized as an extension of the surrounding single crystal, after which a second heat treatment that has a higher temperature than that in the first heat treatment is carried out, and elimination of the crystal defects near the amorphous/single crystal interface is attempted.

Meanwhile, in the case that low-temperature annealing similar to the first embodiment is carried out, it is not always the case that the crystal defects near the amorphous/single crystal interface cannot be eliminated, but according to the manufacturing method of the first embodiment, it is possible to solve the problem of attempting to eliminate crystal defects of the semiconductor layer due to the introduction of dopants. This second embodiment simply lists effective examples in such cases where crystal defects near the amorphous/single crystal interface are generated due to low-temperature annealing.

[3-2] Heat Treatment Conditions

Figure 19A:
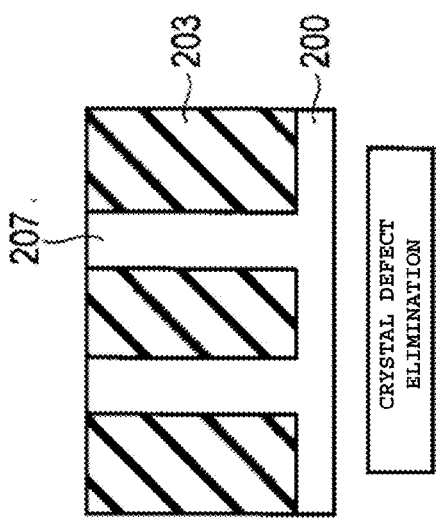
FIGS. 19A to 19C are diagrams that explain the manufacturing method of a semiconductor device according to a second embodiment.
Figure 19B:
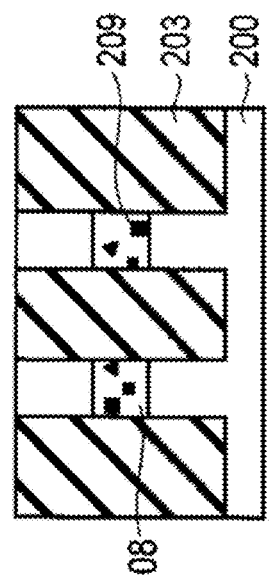
Figure 19C:
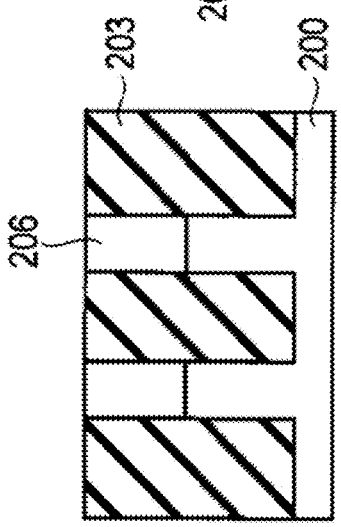

In the second embodiment, a first heat treatment is carried out after ion implantation, and after this first heat treatment, a second heat treatment is carried out. Here, in the first heat treatment, the amorphous layer is single crystallized by solid-phase epitaxial growth, and in the second heat treatment, the recovery of the crystal defects that are generated at the interface of the amorphous layer and the single crystal layer is attempted. Such conditions of the first and second heat treatments according to the second embodiment are described with reference to FIG. 19.

The temperature at the time of the first heat treatment is preferably a low-temperature higher than or equal to 200° C. and lower than or equal to 700° C. Further, taking into account the nucleus generation frequency of crystal nuclei 209 due to dopant dispersion and heat, the upper limit temperature during the first heat treatment is preferably lower than or equal to 600° C., and more preferably lower than or equal to 550° C. This is because if it is lower than or equal to 600° C., crystal nuclei 209 are not easily generated due to heat and if it is lower than or equal to around 550° C., excessive dispersion of dopants can be suppressed.

As mentioned above, there is a fear that multiple point defects may be generated immediately below the amorphous layer 206 at the time of ion implantation, but in the case that the temperature at the time of solid-phase epitaxial growth is high, it is possible that these point defects grow to a huge size. In order to eliminate this grown crystal defect 208 (FIG. 19B), there is a need to increase the temperature and time of the second heat treatment, that is, to increase the heat load, but this is not favorable in terms of dopant dispersion. However, in the case of simply lowering the heat treatment temperature, because the speed of solid-phase epitaxial growth decreases exponentially, the annealing time increases, and productivity plummets substantially when heat treatment is carried out at a temperature lower than 500° C. by RTA, etc.

Therefore, as a method for the first heat treatment, it is preferable to use microwave annealing. With microwave annealing, since the speed of solid-phase epitaxial growth is fast, it becomes possible to completely recrystallize the amorphous layer 206 into the adjacent single crystal material, for example, at a temperature around 400° C., while keeping the growth of point defects immediately below the amorphous layer 206 to a minimum.

For the temperature of the second heat treatment, in order to recover crystal defects 208, it is preferable to use a temperature that is higher than the temperature during the first heat treatment. Also, for the method of the second heat treatment, it is possible to use, for example, microwave annealing, RTA, FLA (Flash Lamp Annealing), LSA (Laser Spike Annealing), etc.

For example, as the second heat treatment, it is also possible to use RTA at around 1,000° C. However, in the present embodiment, since the growth of point defects is suppressed by sufficiently using low-temperature microwave annealing as the first heat treatment, it is possible to further decrease the temperature of the second heat treatment for the crystal defects recovery from 1,000° C. Since the temperature of the second heat treatment differs depending on the specs of the transistor and dopant concentration, it is necessary to configure it so that the leak current fulfills the desired specs, but by lowering the heat treatment temperature, it becomes possible to prevent the dispersion of dopants as much as possible.

Meanwhile, in the present embodiment, since the amorphous region is already re-crystallized by the first heat treatment, the problem where microscopic regions polycrystallize due to the second heat treatment does not occur.

[3-3] Manufacturing Method

Figure 20:
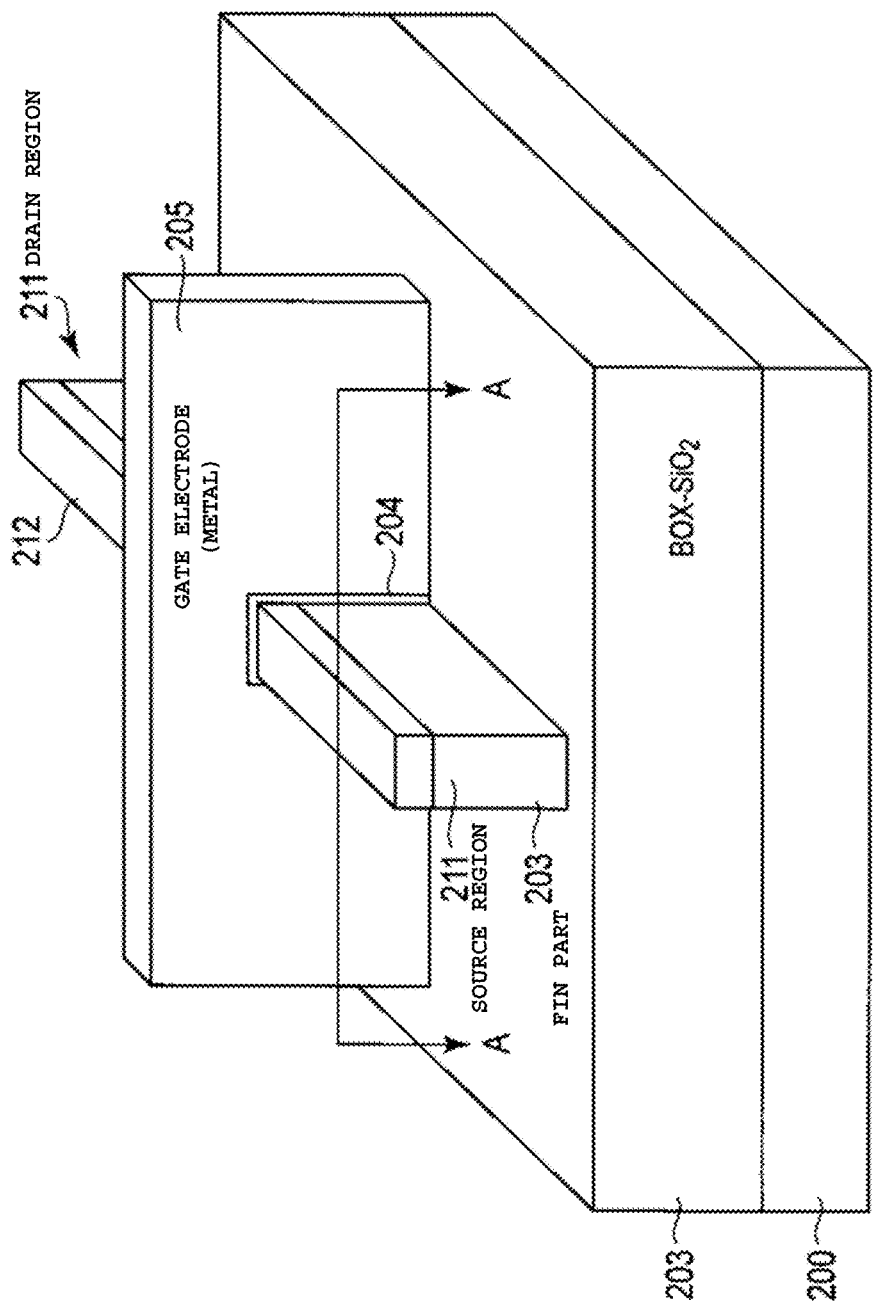
FIG. 20 is a schematic diagram that shows a fin FET according to the second embodiment.

In the second embodiment, as shown in FIG. 20, an example that is applied to a device that possesses a three-dimensional structure like a fin FET will be used. Meanwhile, the present embodiment can, of course, be applied to planar-type transistors as well. However, the effects of the present embodiment are likely to be larger when applied to a three-dimensional structure than a planar-type. Further, to simplify the description, an example where only a fin FET that has an n-type channel is formed on a single crystal silicon substrate is shown, but it can, of course, be applied to cases of CMOS configurations that include both an n-type and a p-type transistor. Also, the subject to which the present embodiment is applied can be a logic LSI, or a memory device, such as DRAM, NAND/NOR flash memory, etc.

The manufacturing method for FINFET according to the second embodiment is described using FIG. 21. This FIG. 21 is a cross-section along the A-A line in FIG. 20.

Figure 21C:
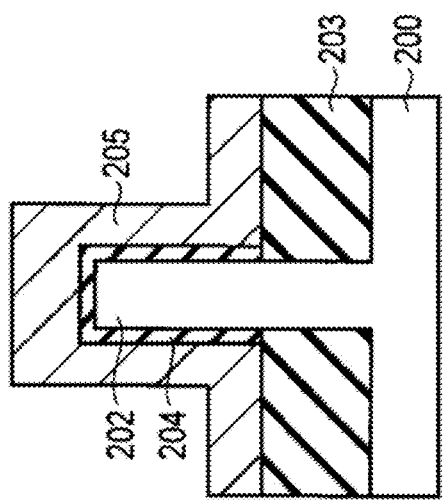
Figure 21B:
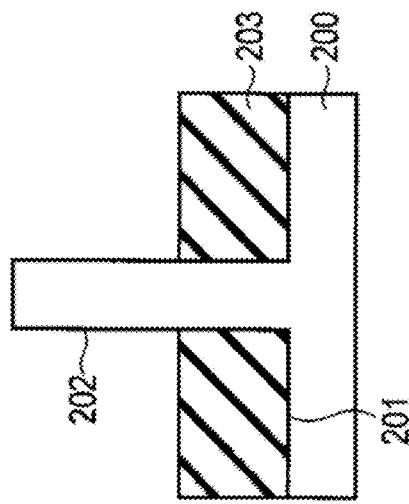
Figure 21A:
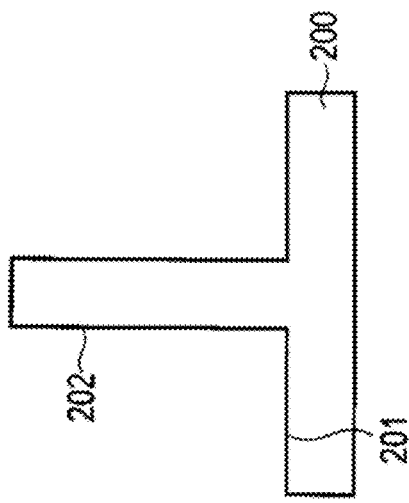

First, as shown in FIG. 21A, a silicon substrate 200 is prepared, and the adjustment for the desired substrate concentration is carried out. Next, on the silicon substrate 200, a thermal oxidation film (not shown in the drawing) of around 2 nm is formed. Next, on the thermal oxidation film, as a hard mask for fin processing, a SiN film (not shown) of around 80 nm is formed. After which, using photolithography and dry etching, a groove 201 is formed in the silicon substrate 200, and a fin part 202 of the silicon substrate 200 is formed. In this fin part 202, the width is, for example 15 nm and the depth is around 150 nm.

Next, as shown in FIG. 21B, the groove 201 becomes buried by around 60 nm in the insulating film 203 that becomes the element isolating region, and STI (Shallow Trench Isolation) is formed. For this insulating film 203, for example, a coating film such as polysilazane is used.

Next, as shown in FIG. 21C, ion implantation that is necessary for punch through stoppers, etc., is carried out at the base part of the fin part 202. Next, a gate insulating film 204 is formed on the exposed surface of the fin part 202, and a gate electrode 205 is formed on the gate insulating film 204 and insulating film 203. Here, the gate insulating film 204 is, for example, an $SiO_2$ film of around 3 nm that is formed by thermal oxidation, and the gate electrode 205 is a polycrystalline silicon film of around 150 nm that has been adjusted to an appropriate concentration. Of course, the gate insulating film 204 can be a high-dielectric constant (high-k) film, and the gate electrode 205 can be a laminated layer of metal or polysilicon and metal. Afterwards, after a hard mask (not shown in the drawing) is formed, a gate electrode 205 is patterned into a desired shape by photolithography and dry etching.

Next, the formation steps of the source/drain region shall be discussed. The source/drain of microscopic transistors are normally formed by ion implantation performed twice: that is, a first ion implantation for forming a shallow extension region, and a second ion implantation for forming a deep source/drain region. Meanwhile, in the following process chart, the gate electrode 205 and the gate insulating film 204 are omitted.

First, as shown in FIG. 21D, a first ion implantation is carried out to form a relatively shallow extension region in the part close to the gate electrode 205. This first ion implantation is carried out, for example, under the conditions of 1 keV of arsenic ion, 5E14 $cm^{-2}$, with a tilt of around 20°. The arsenic ion could be substituted by phosphorus ion. Also, instead of beam line implantation, the plasma doping method that uses the discharge of $AsH_3$ and $PH_3$ gases can also be applied.

In this kind of first ion implantation, since the width of the fin part 202 is small, the side wall of the fin part 202 receives ion irradiation from the left and right. With this, the protrusion of the fin part 202 is almost completely amorphized, and an amorphous layer 206 is formed. For example, the height H and the width L of this amorphous layer 206 satisfies the relationship L/H<4.

Next, as shown in FIG. 21E, as a first heat treatment, microwave annealing is carried out and the amorphous layer 206 is reverted to a single crystal silicon layer 207. That is, having the minute area part where the amorphous layer 206 and the substrate 200 are touching as the origin point and inducing solid-phase epitaxial growth, the amorphous layer 206 is grown into a single crystal silicon layer 207. The conditions of this first heat treatment are, for example, irradiating microwave of 2.45 GHz-25 GHz for around 1.5 kW-2 kW, and at a temperature around 350° C.-550° C., treatment is carried out for around 5 min-30 min. The treatment atmosphere is, for example, $N_2$, 100%. Regarding pressure, in order to prevent discharge due to microwave, it should be a high-pressure of around 0.9 kPa. Also, at the time of microwave irradiation, by blowing $N_2$ gas over the substrate 200, forced substrate cooling can be carried out.

Next, as shown in FIG. 21F, the second heat treatment is carried out for the recovery of crystal defects 208 that could not be eliminated by microwave annealing. For example, as the second heat treatment, by using RTA and carrying out treatment in an $N_2$ atmosphere, at 780 Torr, 900° C. for around seconds, crystal defects 208 that are formed near the junction are caused to disappear. With this, a low-leak pn-junction is completed.

Meanwhile, the second heat treatment is not limited to RTA, and, for example, the irradiation power for the microwave could be increased from the first heat treatment to around 3 kW and apply the microwave annealing, or novel annealing methods could be applied, such as FLA (Flash Lamp Annealing) and LSA (Laser Spike Annealing) which carry out processing at higher than or equal to 1,200° C. in a few msec. In any case, it is important to configure it so that the junction leak current fulfills the desired specs of the device. Further, while FLA and LSA are higher temperature than RTA, because they are extremely rapid treatments, dopant dispersion does not become a problem.

With these kinds of steps, the extension region that is formed on the fin part 202, which, having a shape with a high aspect ratio, will completely single crystallize to the uppermost part, and possesses a high dopant activation rate in the vicinity of 1E20 $cm^{-3}$. Further, crystal defects in the amorphous/single crystal silicon interface are scarce, and leak current can be reduced.

Next, a laminate layer (not shown in the diagram) of $SiN/SiO_2$ is formed on the gate electrode 205, and a side wall (not shown in the drawing) of the gate electrode 205 that uses etch back by dry etching is formed.

Figure 22A:
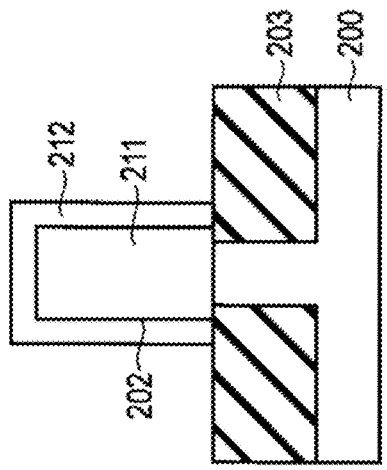
FIGS. 22A to 22C are cross-section diagrams that show the manufacturing process of the fin FET according to the second embodiment, following FIG. 21.

Next, as shown in FIG. 22A, a select epitaxial growth of silicon is carried out at around 800° C. With this, an epitaxial layer 210 of around 30 nm is selectively grown at the silicon exposure area (single crystal layer 207) of the fin part 202 that becomes the source/drain region. By making the fin part 202 thick in this way, the serial resistance can be reduced.

Figure 22B:
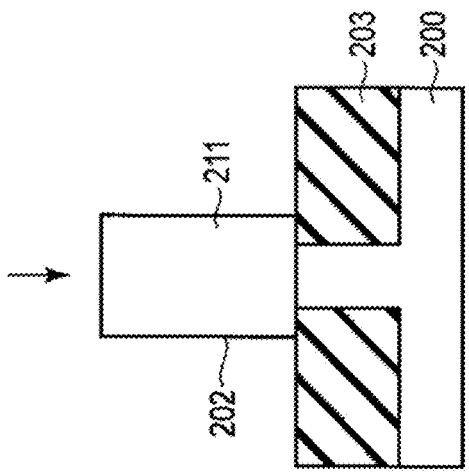

Next, as shown in FIG. 22B, a second ion implantation for the forming of deep source/drain is carried out. This second ion implantation is carried out, for example, under the conditions of 3 keV of arsenic ion, 3E15 $cm^{-2}$, with a tilt of around 20° as with the first ion implantation. In this case, too, phosphorus can be used instead of arsenic as the ion type. After that, heat treatment is carried out, and the source/drain region 211 with activated dopants is completed.

Figure 22C:
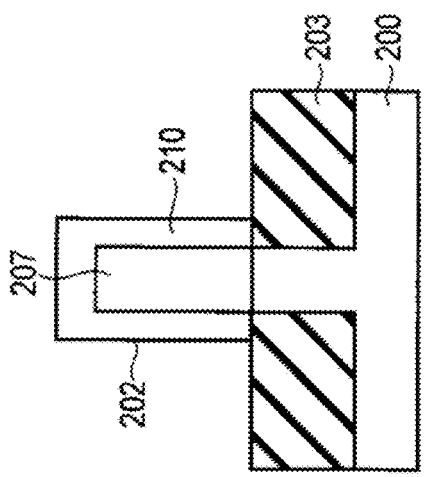

Next, as shown in FIG. 22C, in the silicon exposure part of the source/drain region 211, for example, a silicide layer 212 formed of Ni is selectively formed. After that, it goes on to the wiring step. After the wiring step, it is possible to apply a standard LSI manufacturing process as is.

Figure 23A:
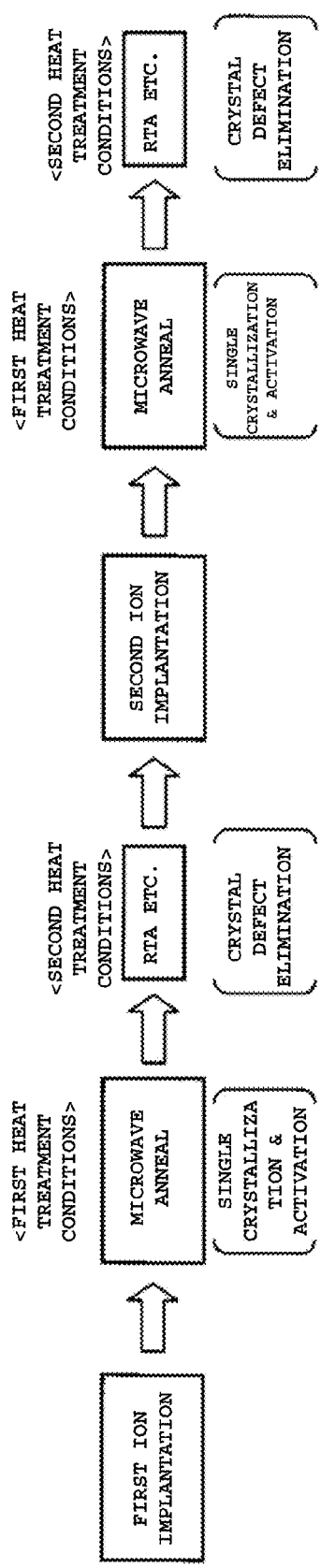
FIGS. 23A to 23C are diagrams that explain an example of the first and second heat treatments according to the second embodiment.
Figure 23B:
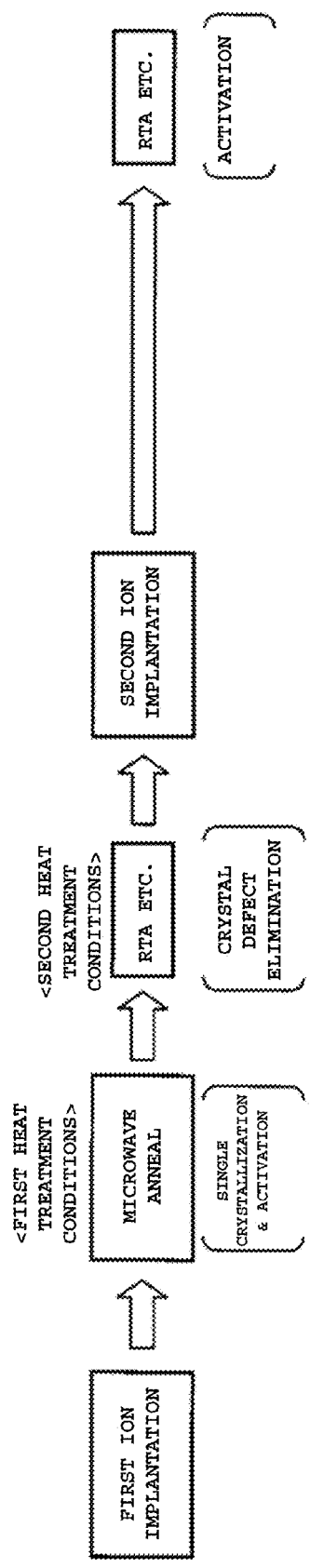
Figure 23C:
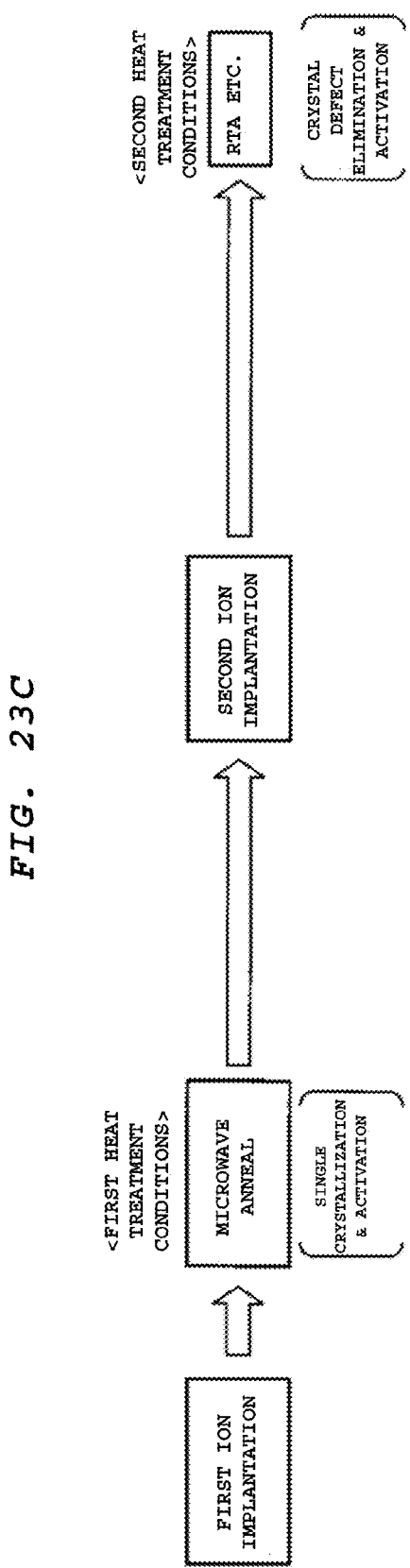

Meanwhile, for the heat treatment after the second ion implantation in the step in FIG. 22B, various methods are possible, for example, such as those shown in FIG. 23A through FIG. 23C.

As shown in FIG. 23A, after the second ion implantation, as with after the first ion implantation, microwave annealing under the first heat treatment conditions is carried out, after which RTA, etc., of the second heat treatment conditions can be carried out.

As shown in FIG. 23B, after the second ion implantation, RTA can be carried out by itself, without carrying out microwave annealing. The reason for this is as follows. Before the second ion implantation, a selective silicon epitaxial layer 210 like that shown in FIG. 22A is formed and since the fin width is relatively thick, single crystal recovery is easier when compared to the extension forming timing in the first ion implantation. Therefore, the heat treatment after the second ion implantation can be just RTA.

As shown in FIG. 23C, after the first ion implantation, microwave annealing under the first heat treatment conditions is carried out for the single crystallization of the extension region, after which RTA for crystal defects elimination is not done, and the second ion implantation is carried out. After that, recovery of crystal defects can be conducted with RTA under the second heat treatment conditions for the dopant activation by the second ion implantation. Therefore, the first heat treatment and the second heat treatment in the present embodiment are preferably done in the order of the first heat treatment followed by the second heat treatment, but the first heat treatment and the second heat treatment do not necessarily have to be carried out in succession.

Meanwhile, in the description of FIG. 23 above, the treatment temperature under the first heat treatment condition is higher than or equal to 200° C. and lower than or equal to 700° C., and is more preferable when lower than or equal to 600° C., and even more preferable when lower than or equal to 550° C. Further, the treatment temperature under the second heat treatment is configured to be higher than the temperature at the time of the first heat treatment.

[3-4] Effects

According to the second embodiment described above, in the case that the single crystal layer is amorphized by ion implantation, the first heat treatment using low-temperature microwave annealing is carried out, after which the second heat treatment that is higher temperature than the first heat treatment is carried out. With this, due to the first heat treatment, the semiconductors of the amorphized microscopic regions can be recrystallized to a single crystal layer 207 without polycrystallization, and with the second heat treatment, recovery of the crystal defects 208 that are generated at the interface of the amorphous layer 206 and the single crystal layer 207 becomes possible.

Therefore, it becomes possible to suppress the dispersion of dopants that are introduced into the microscopic source/drain region of the three-dimensional structured transistor, and activate a density of dopants around 1E20 $cm^{-3}$, so it becomes possible to form a device having low resistance with a small leak current. Therefore, according to the present embodiment, it is possible to envisage semiconductor devices with higher performance and lower energy consumption.

[4](Third Embodiment)

First, the microwave annealing that is used in the first and second embodiments is discussed.

In the manufacturing steps of semiconductor devices, furnaces, etc., are generally used for the steps that require heating (annealing) such as activation, cyrstallization, oxidation/dispersion, and film-forming, etc. In this case, heating is external heating carried from outside the wafer. On the other hand, with electromagnetic heating, which is a high-efficiency heating method exemplified by microwave, the heated object that absorbs the irradiated electromagnetic waves itself is an internal heater.

An example of a problem with electromagnetic heating includes the difficulty in ensuring temperature uniformity in the wafer surface. In the case of silicon wafers, it is known that the absorption rate of microwaves has temperature dependence. The absorption rate near room temperature rises precipitously as the temperature goes up. For this reason, if temperature variation in the wafer surface occurs in the early stages of heating, the absorption rate becomes higher in the areas with high temperature, and as a result, the temperature difference with other areas grows acceleratingly.

Another example of a problem of electromagnetic heating is that the initial rise of temperature rise is slow. As mentioned earlier, the microwave absorption rate of silicon, from room temperature to around 200° C., is higher the higher the temperature, and conversely, when the temperature is low, hardly any microwave is absorbed. For this reason, even when trying to apply microwave to heat from room temperature, in the initial stages, temperature rise happens only extremely slowly. Thus, it is difficult to shorten the treatment time and improve productivity.

Therefore, in the third embodiment, with regard to microwave annealing, an annealing method for semiconductor device and a device for it are proposed, wherein the heating uniformity in the wafer surface is improved, and it uses microwave that can shorten the treatment time.

[4-1] The Temperature Dependence of Magnetic Properties

Figure 24:
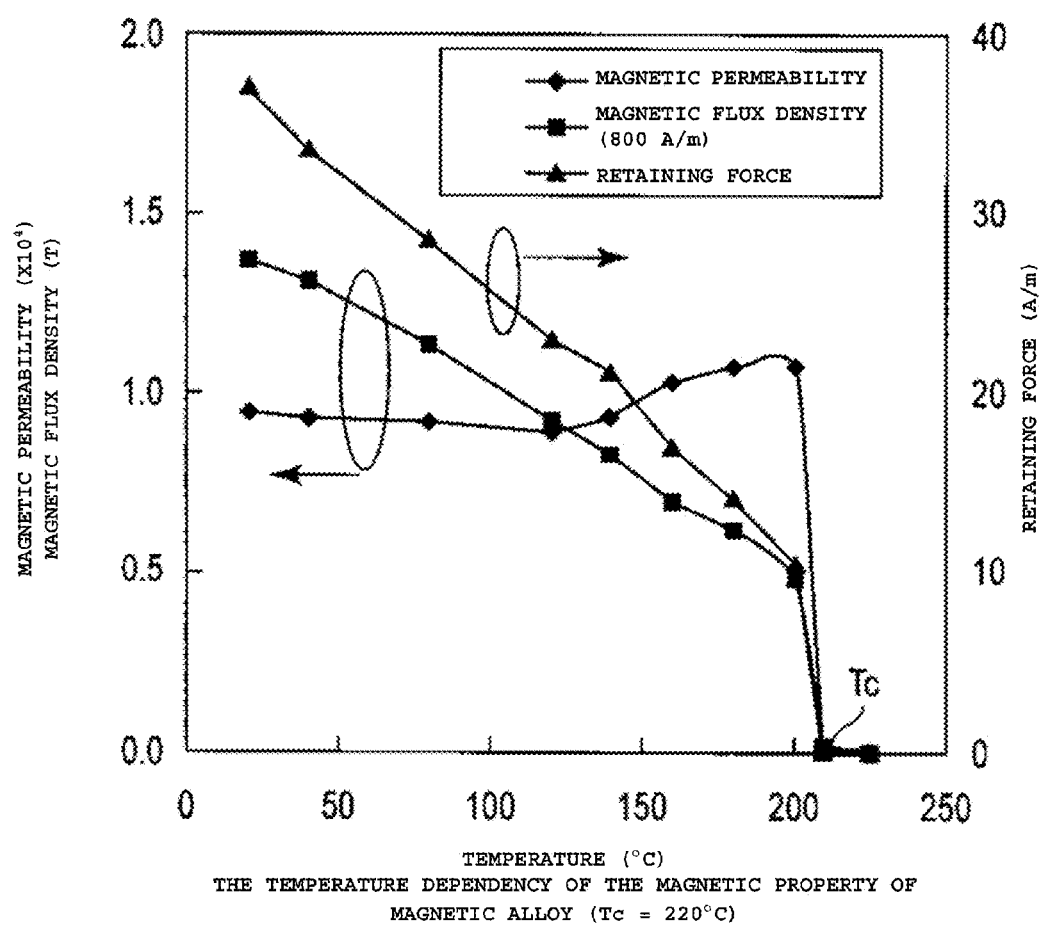
FIG. 24 is a diagram that shows the temperature dependence of the magnetic properties according to a third embodiment.
Figure 25:
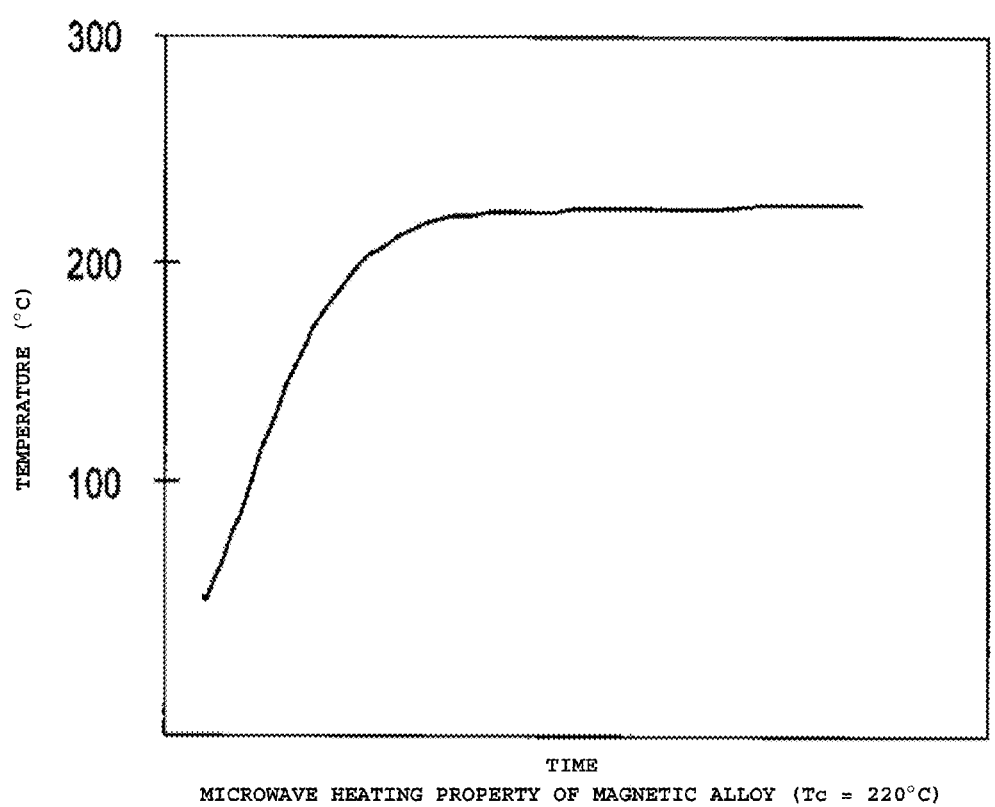
FIG. 25 is a diagram that shows the microwave heating characteristic of the magnetic material according to the third embodiment.

The temperature dependence of magnetic properties is described using FIG. 24 and FIG. 25.

When a conducting body is exposed to a microwave applied atmosphere, alternating flux penetrates the conducting body, and an eddy current of high density is generated in the conducting body so as to eliminate the alternating flux.

The Joule heat by this eddy current is what is called the induction heating by microwave.

Here, in the case that the conductive body has a ferromagnetic property (that is, has a finite magnetic permeability μ), magnetic lines penetrate the conductive body, causing an eddy current, and induction heating occurs. On the other hand, in the case that the conductive body loses the ferromagnetic property (that is, its magnetic permeability becomes zero), the magnetic lines cannot penetrate the conductive body, and eddy current will not be generated, so heating will not occur. In this way, the temperature over which a ferromagnetic body loses its ferromagnetism is called the Curie temperature.

FIG. 24 shows the magnetic property of an example magnetic alloy, nickel-iron (Ni—Fe) alloy, whose Curie temperature Tc is 220° C. As shown in FIG. 24, by heating the magnetic alloy with microwave, the magnetic permeability of this magnetic alloy rises precipitously near the Curie temperature Tc (220° C.), and when it reaches the Curie temperature Tc (220° C.), it can be seen that the magnetic alloy loses its ferromagnetic property. Also, as shown in FIG. 25, it can be seen that the heating temperature of the magnetic alloy will not rise higher than the Curie temperature (220° C.), and that constant temperature is maintained.

So, in the third embodiment, utilizing this kind of magnet characteristic, a heating element made of magnetic materials is used as an auxiliary heating unit for the microwave annealing device.

[4-2] Microwave Annealing Device

Figure 26:
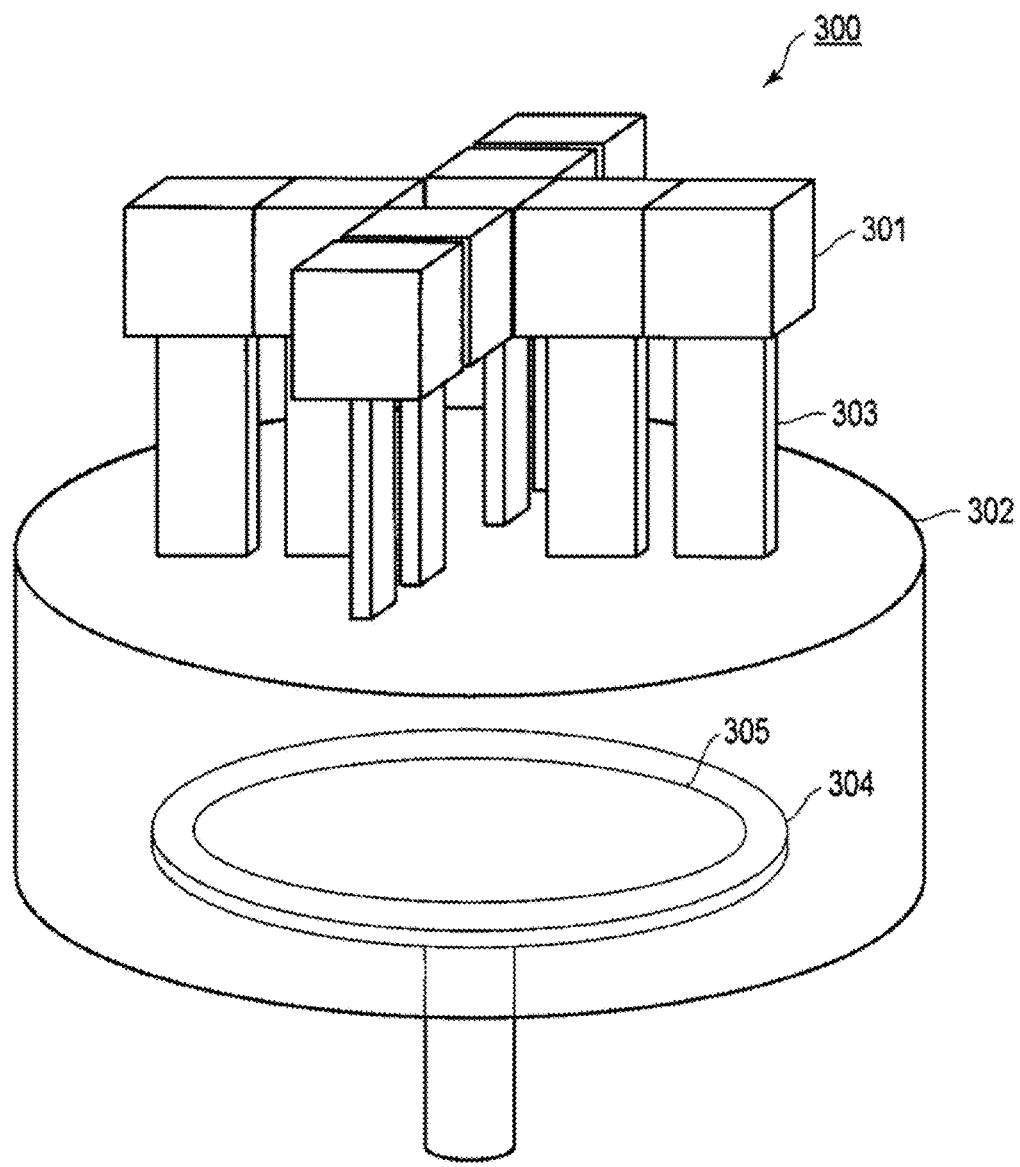
FIG. 26 is a schematic diagram that shows the microwave annealing device according to the third embodiment.

The microwave annealing device according to the present embodiment is described using FIG. 26.

As shown in FIG. 26, the microwave annealing device 300 is configured to include a microwave transmitter 301 that transmits microwaves, a chamber 302 to which microwaves are led, a waveguide 303 that brings microwaves from the microwave transmitter 301 to the chamber 302, and an auxiliary heating unit 304 that is installed in the chamber 302. The auxiliary heating unit 304 is configured with, for example, a hotplate that is placed in contact with or near a treatment wafer (heated object) 305, and a parallel plate heating unit such as susceptors, etc. The auxiliary heating unit (for example a hotplate) 304 comprises, for example, a support base and a heating element layer. The heating element layer is placed on the support base, and heats the treatment wafer by absorbing microwaves and emitting heat itself.

The support base is formed from a non-magnetic material with high durability and high heat-resistivity. Examples of the non-magnetic material include $Al_2O_3$, SiC, etc.

The heating element layer is formed from a magnetic material that absorbs microwaves and functions as a heating element by induction heating. The magnetic material is made from a single body magnetic material that has a Curie temperature that corresponds to the desired auxiliary heating temperature by the auxiliary heating unit 304 or magnetic alloys that possess a desired Curie temperature wherein the composition ratio is adjusted appropriately. That is, according to the design heating temperature of the auxiliary heating unit (for example hotplates) 304, the magnetic characteristic (magnetic permeability) of the magnetic material is appropriately selected. Examples of magnetic materials include, for example, single-body metals such as iron (Fe), cobalt (Co), nickel (Ni), chromium (Cr), etc. and their alloys (for example, permalloys, etc.). For example, as a temperature-sensitive magnetic alloy, the Curie temperature can be adjusted at will from room temperature to around 450° C.

Meanwhile, the heating element layer is not limited to being configured by just magnetic materials; it only needs to include magnetic materials.

[4-3] Microwave Annealing Method

In the present embodiment, in the chamber 302 of the microwave annealing device 300, the wafer 305 is supplementarily heated with the auxiliary heating unit (for example hot plates) 304. At this time, the auxiliary heating unit 304 emits heat due to induction heating and heats the wafer by the emitted-heat.

Here, to improve the heating uniformity of the microwave annealing, it is important that the temperature uniformity at the early stages of heating is improved. In the present embodiment, utilizing the precipitous change in magnetic permeability near the Curie temperature Tc, auxiliary heating in microwave annealing is carried out in a self-limiting manner.

For example, a case where iron (Fe) is used as the auxiliary heating unit 304 is considered. The Curie temperature of iron is 770° C. By applying microwaves, due to induction heating, the auxiliary heating unit (Fe) 304 will be heated up to 770° C., but will not become a temperature higher than 770° C., and so the heating temperature will be maintained at 770° C.

In this way, by employing a magnetic material that has a Curie temperature that corresponds to the desired auxiliary heating temperature as the heating element of the auxiliary heating unit 304, auxiliary heating can be done at a constant temperature, extremely accurately, with good uniformity, and in a microwave applied atmosphere.

[4-4] Effects

According to the third embodiment above, the annealing device for semiconductor devices that use microwaves has an auxiliary heating unit 304, and this auxiliary heating unit 304 is configured with magnetic materials that have a Curie temperature that corresponds to the desired auxiliary heating temperature. The auxiliary heating unit 304 that is made from this magnetic material will be heated to the Curie temperature by induction heating by the microwave application, but will not be heated to above the Curie temperature. For this reason, in a microwave applied atmosphere, auxiliary heating can be done at the desired temperature extremely accurately and with good uniformity. Therefore, in microwave annealing, the temperature uniformity in the wafer surface in the initial stages improves, and because of this, the in-plane uniformity of the absorption rate of microwaves by the wafer improves, and so as a result the in-plane uniformity of microwave annealing improves.

Additionally, the magnetic permeability of the auxiliary heating unit 304 that is made from magnetic materials rises precipitously near the Curie temperature. For this reason, even in cases of heating by applying microwaves from room temperature, in the initial stages, the absorption rate of microwaves is high, and the initial rise in the temperature rise is quick. Therefore, it is possible to shorten the treatment time and to improve productivity.

By applying the third embodiment to the first embodiment, the initial temperature uniformity in the wafer surface improves, and due to this, the in-plane uniformity of the absorption rate of microwaves by the wafer is improved and with the activity of dopants, recovery of crystal defects of the substrate can be attempted, and a higher performance semiconductor device can be manufactured. Also, at the same time, treatment time can be shortened as well as improve productivity.

By applying the third embodiment to the second embodiment, the initial temperature uniformity in the wafer surface improves, and due to this, the in-plane uniformity of the absorption rate of microwaves by the wafer is improved, and it becomes possible to suppress the dispersion of dopants that are introduced to the microscopic source/drain region of the three-dimensionally structured transistors, and activate around 1E20 cm$^{-3}$, and so a higher performance semiconductor device that is low resistance and has little leak current can be formed. Also, at the same time, treatment time can be shortened as well as improve productivity.

As described above, according to the third embodiment, the temperature uniformity within the wafer surface improves, and it is possible to shorten the treatment time.

Meanwhile, the annealing method and the device according to the third embodiment can be utilized for the first and second embodiments as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of re-crystallizing an amorphous semiconductor layer into a single crystal after exposure of the amorphous semiconductor layer to ions used in ion implantation, comprising:
    re-crystallizing the implanted amorphous semiconductor layer into a single crystal semiconductor layer by heat treating the amorphous semiconductor layer, using microwaves, to a first temperature that is greater than or equal to 200° C. and less than or equal to 700° C.; and then
    heat treating the single crystal semiconductor layer, using energy other than microwaves, to a second temperature that is greater than the first temperature.

2. The method of claim 1, wherein the implanted amorphous semiconductor layer has a feature having a width L and a height H, and the relationship L/H<4 is satisfied.

3. The method of claim 2, wherein the first temperature is between 200° C. and 600° C.

4. The method of claim 1, wherein the implanted amorphous semiconductor layer comprises amorphous silicon within a semiconductor substrate.

5. The method of claim 1, wherein the implanted amorphous semiconductor layer comprises silicon extending from a semiconductor substrate.

6. The method of claim 5, further comprising:
    implanting ions into the single crystal semiconductor layer after recrystallizing the implanted amorphous semiconductor layer using microwaves.

7. The method of claim 1, wherein the implanted amorphous semiconductor layer is supported on a support having a ferromagnetic material therein and having a Curie temperature between 200° C. and 700° C.

8. A manufacturing method for a semiconductor device, the method comprising:
    performing ion implantation on a semiconductor layer and forming an amorphous layer on a surface of the semiconductor layer;
    a first heat treatment step, using microwave annealing, where the amorphous layer is heated to a first temperature that is greater than or equal to 200° C. and less than or equal to 700° C., and the amorphous layer is re-crystallized into a single crystal; and
    a second heat treatment step after the microwave annealing, using energy other than microwaves, where the single crystal is heated to a second temperature that is greater than the first temperature, wherein a width of the amorphous layer is L and a height of the amorphous layer is H, the relationship L/H<4 is satisfied.

9. The manufacturing method for a semiconductor device according to claim 8, wherein the second heat treatment step recovers crystal defects at an interface between the semiconductor layer and the amorphous layer.

10. The manufacturing method for a semiconductor device according to claim 8, wherein
    the first temperature is greater than or equal to 200° C. and less than or equal to 600° C.

11. The manufacturing method for a semiconductor device according to claim 10, wherein
    the second heat treatment step is performed with any one of RTA, FLA, and LSA.

12. The manufacturing method for a semiconductor device according to claim 10, further comprising:
    performing an ion implantation on the semiconductor layer between the first heat treatment step and the second heat treatment step.

13. The manufacturing method for a semiconductor device according to claim 8, wherein
    the ion implantation is performed using a plasma treatment.

14. A manufacturing method for a semiconductor device, the method comprising:
    implanting ions on a semiconductor layer and forming an amorphous layer on a surface of the semiconductor layer;
    annealing the amorphous layer in a first heat treatment using microwave energy, wherein the amorphous layer is heated to a first temperature that is greater than or equal to 200° C. and less than or equal to 700° C., and is re-crystallized into a single crystal; and
    heating the single crystal, in a second heat treatment, to a second temperature that is greater than the first temperature after the first heat treatment, using energy other than microwaves.

15. The manufacturing method for a semiconductor device according to claim 14, further comprising:
    recovering crystal defects at an interface between the semiconductor layer and the amorphous layer.

16. The manufacturing method for a semiconductor device according to claim 14, wherein
    the second heat treatment step is performed with any one of rapid thermal annealing, flash lamp annealing, and laser spike annealing.

17. The manufacturing method for a semiconductor device according to claim 14, further comprising:
    implanting ions on a semiconductor layer on the semiconductor layer between the first heat treatment step and the second heat treatment step.

18. The manufacturing method for a semiconductor device according to claim 14, wherein
    the ion implantation is performed using a plasma treatment.

* * * * *